(12) United States Patent
Li et al.

(10) Patent No.: US 8,867,271 B2
(45) Date of Patent: Oct. 21, 2014

(54) THRESHOLD VOLTAGE ADJUSTMENT FOR A SELECT GATE TRANSISTOR IN A STACKED NON-VOLATILE MEMORY DEVICE

(75) Inventors: Haibo Li, Sunnyvale, CA (US); Xiying Costa, San Jose, CA (US); Masaaki Higashitani, Cupertino, CA (US); Man L. Mui, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 180 days.

(21) Appl. No.: 13/484,088

(22) Filed: May 30, 2012

(65) Prior Publication Data
US 2013/0322174 A1 Dec. 5, 2013

(51) Int. Cl.
*G11C 11/34* (2006.01)
(52) U.S. Cl.
USPC ............ 365/185.09; 365/185.22; 365/185.24; 365/185.17; 365/185.02; 365/185.05; 365/185.23; 365/185.29
(58) Field of Classification Search
CPC .... G11C 29/82; G11C 16/04; G11C 16/0483; G11C 29/76; G11C 29/789; G11C 16/3454; G11C 16/3459; G11C 11/5628; G11C 2211/5621; G11C 16/10; G11C 11/5642; G11C 16/12; G11C 16/3418; G11C 16/26; G11C 16/3427; G11C 16/0416; G11C 16/08; G11C 8/08; G11C 16/30; G11C 16/16; G11C 16/14; G11C 16/3445; G11C 16/344; H01L 27/115; H01L 27/11521
USPC ............. 365/185.09, 185.22, 185.24, 185.17, 365/185.02, 185.05, 185.23, 185.29
See application file for complete search history.

(56) References Cited

U.S. PATENT DOCUMENTS

| 7,505,321 B2 | 3/2009 | Scheuerlein et al. |
|---|---|---|
| 7,888,731 B2 | 2/2011 | Kim |
| 2005/0286301 A1 | 12/2005 | Mochizuki |
| 2009/0287879 A1 | 11/2009 | Oh et al. |
| 2010/0124118 A1 | 5/2010 | Lee et al. |
| 2010/0214839 A1 | 8/2010 | Guzzi et al. |
| 2011/0069550 A1* | 3/2011 | Maejima ................. 365/185.11 |
| 2011/0211392 A1 | 9/2011 | Kim et al. |
| 2011/0249503 A1* | 10/2011 | Yamada et al. .......... 365/185.19 |
| 2011/0307646 A1* | 12/2011 | Lee et al. ....................... 711/103 |
| 2012/0170375 A1* | 7/2012 | Sim et al. ................. 365/185.19 |
| 2012/0327713 A1* | 12/2012 | Parat et al. ............... 365/185.17 |

OTHER PUBLICATIONS

International Search Report & The Written Opinion of the International Searching Authority dated Oct. 22, 2013, International Application No. PCT/US2013/039505.

* cited by examiner

*Primary Examiner* — Fernando Hidalgo
(74) *Attorney, Agent, or Firm* — Vierra Magen Marcus LLP

(57) ABSTRACT

In a 3D stacked non-volatile memory device, the threshold voltages are evaluated and adjusted for select gate, drain (SGD) transistors at drain ends of strings of series-connected memory cells. To optimize and tighten the threshold voltage distribution, the SGD transistors are read at lower and upper levels of an acceptable range. SGD transistors having a low threshold voltage are subject to programming, and SGD transistors having a high threshold voltage are subject to erasing, to bring the threshold voltage into the acceptable range. The evaluation and adjustment can be repeated such as after a specified number of program-erase cycles of an associated sub-block. The condition for repeating the evaluation and adjustment can be customized for different groups of SGD transistors. Aspects include programming SGD transistors with verify and inhibit, erasing SGD transistors with verify and inhibit, and both of the above.

16 Claims, 26 Drawing Sheets

Fig. 2C
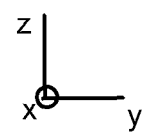
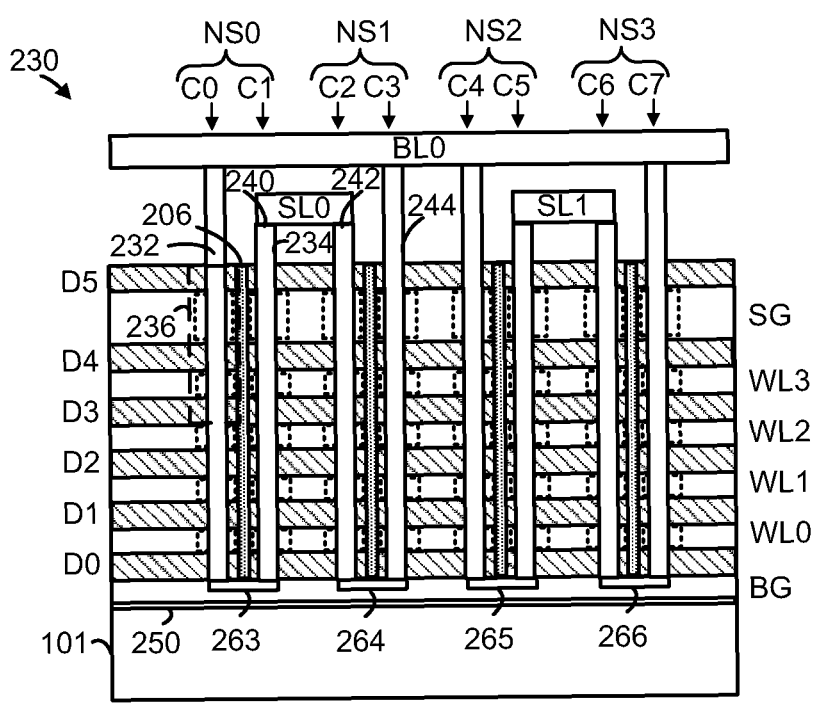

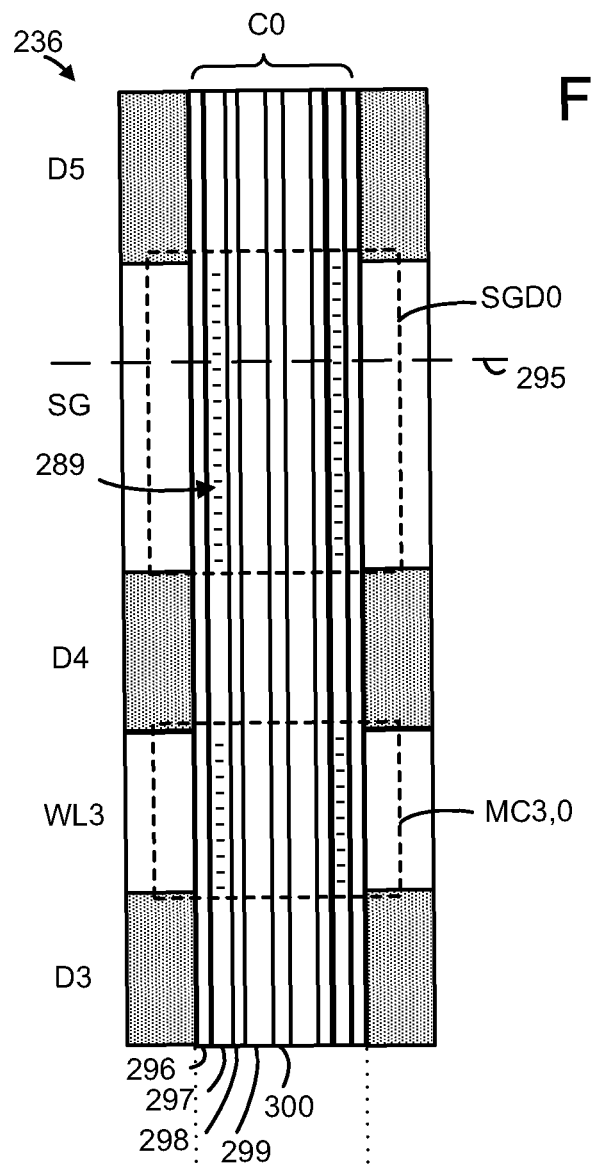
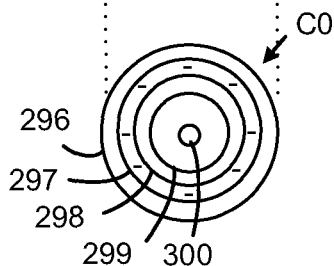

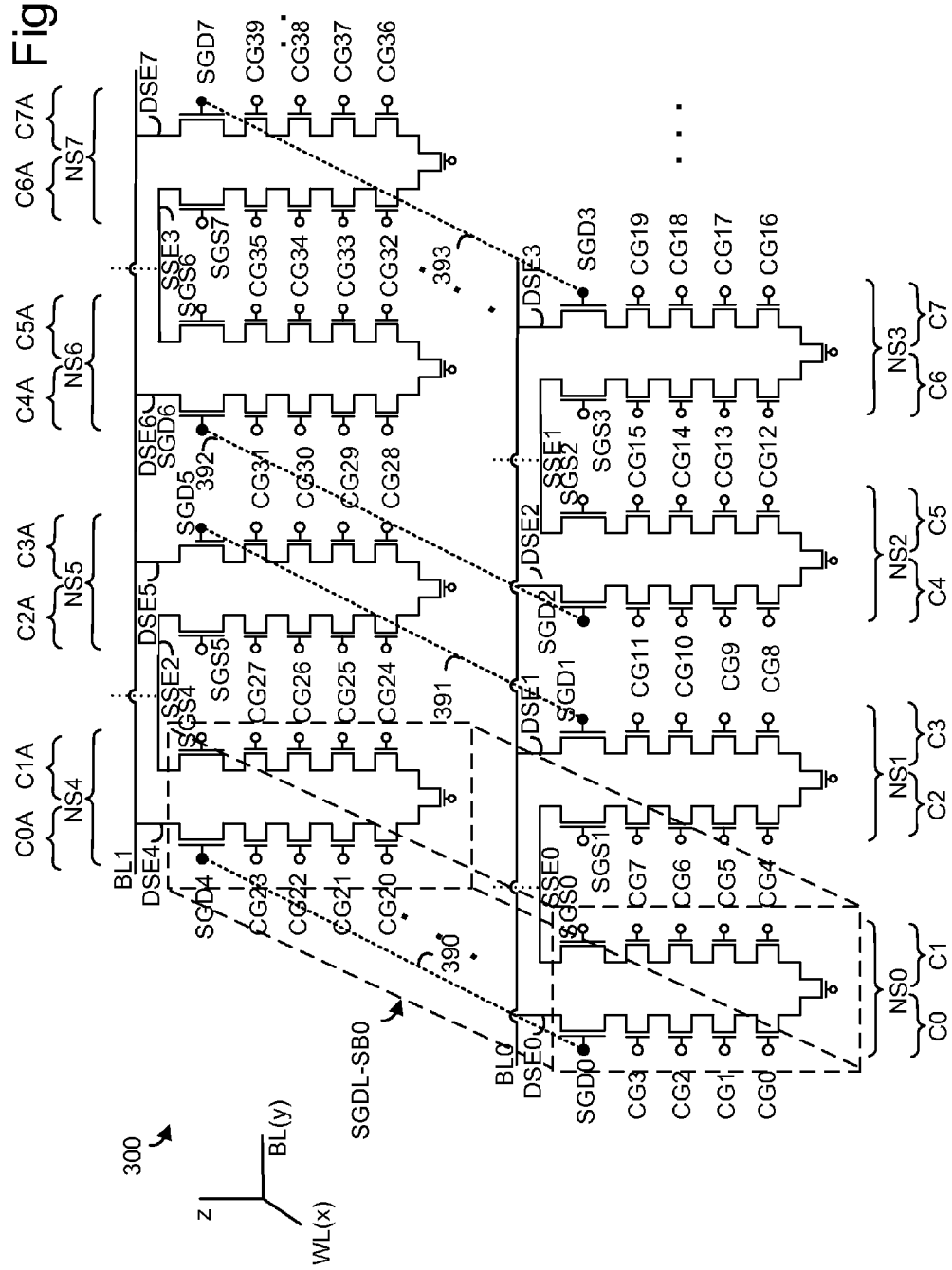

Fig. 4C
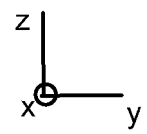
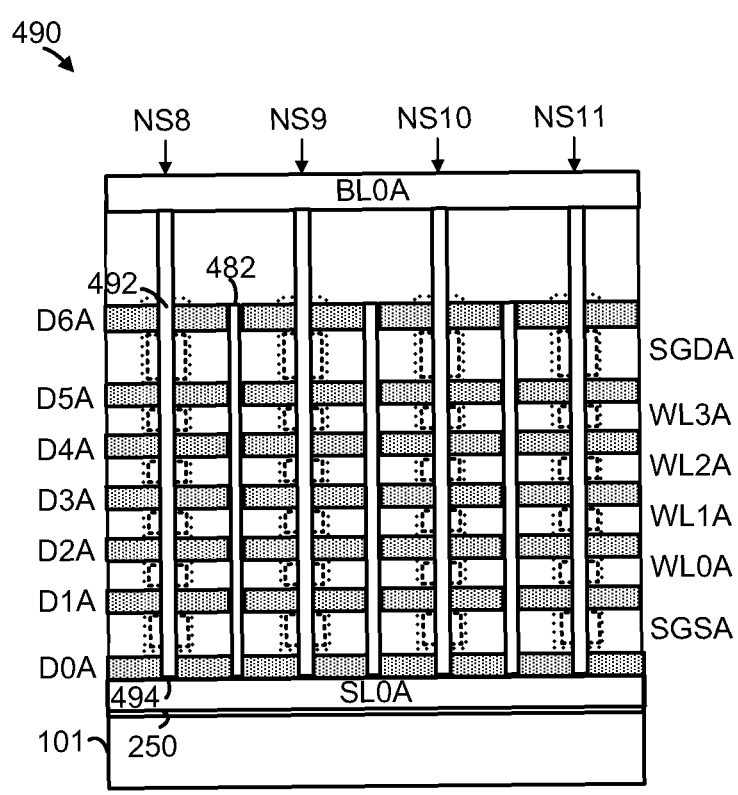

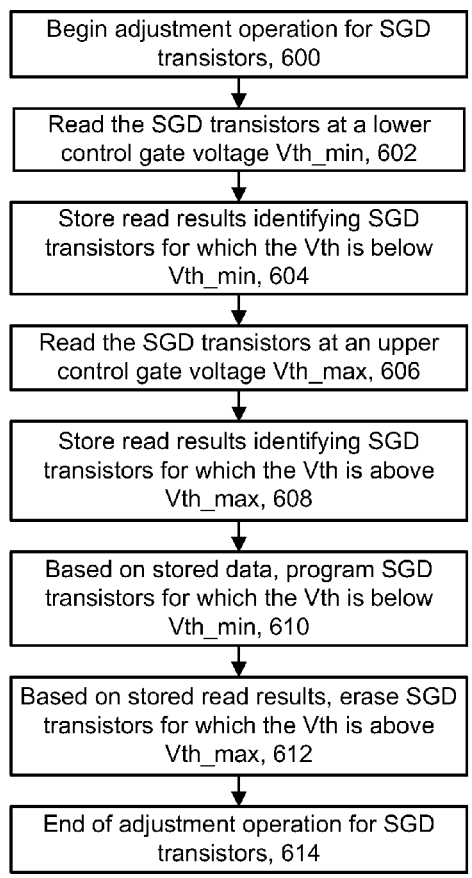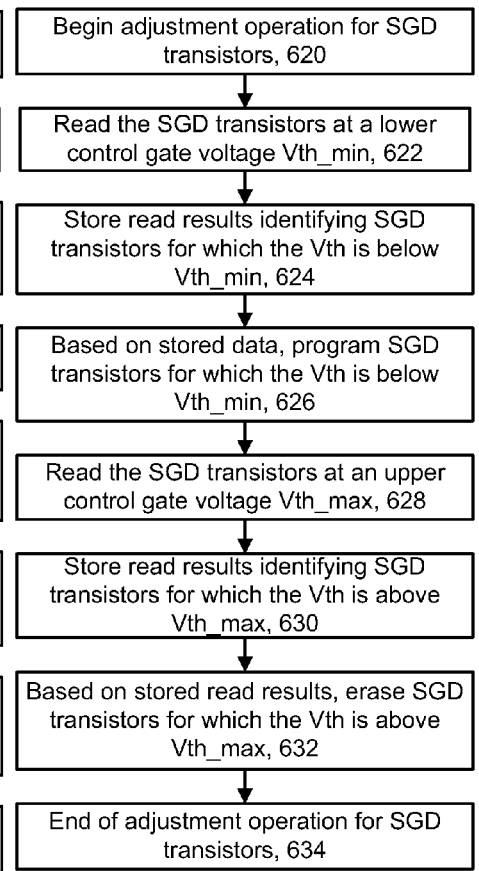

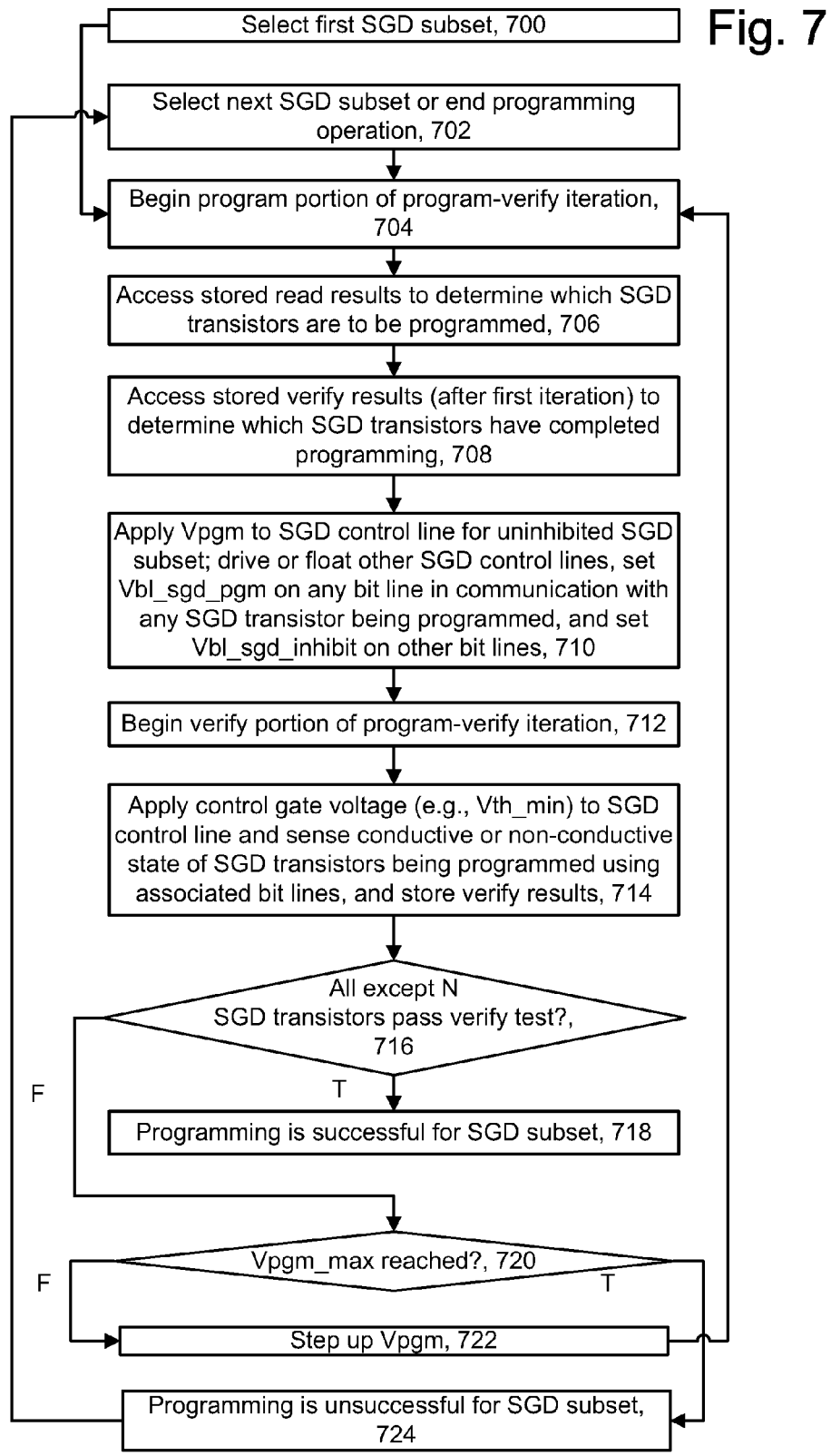

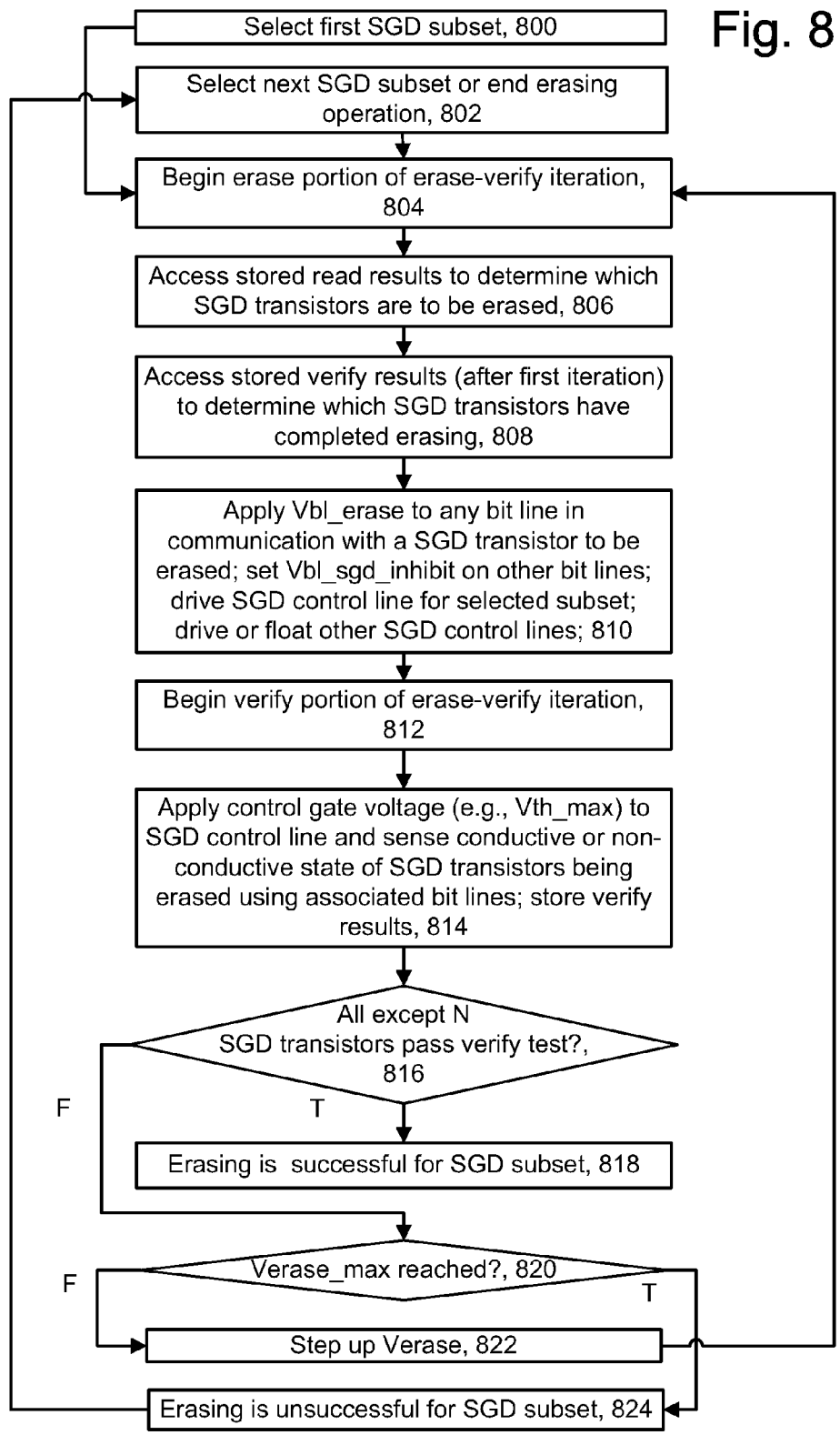

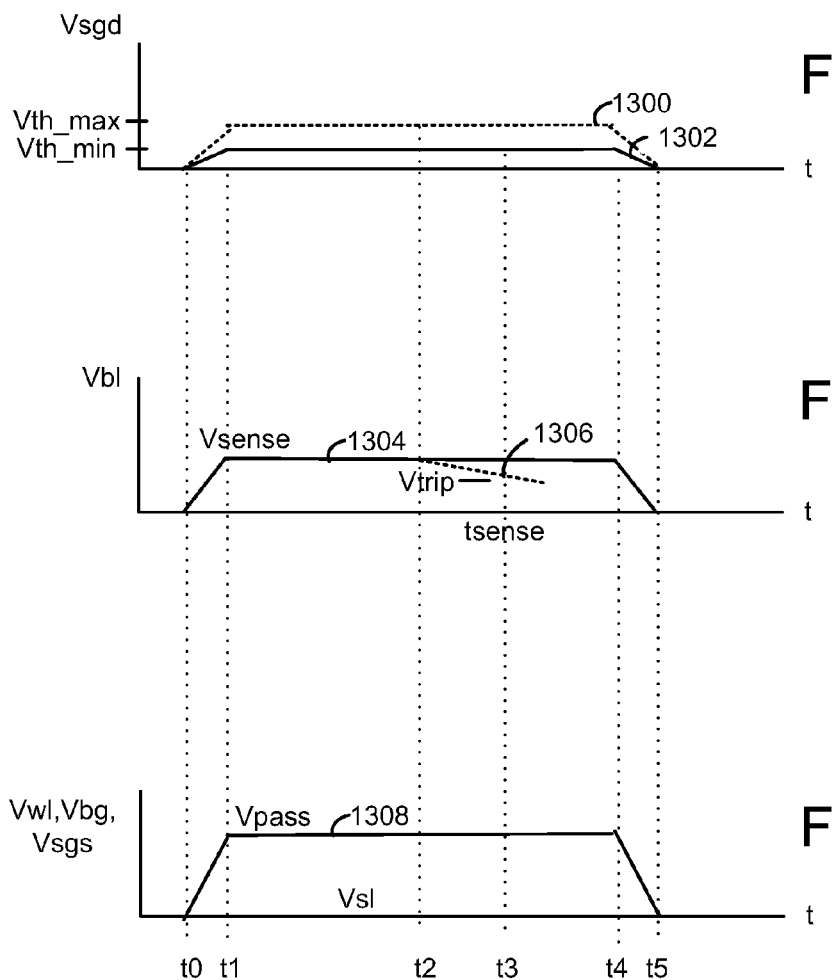

_US 8,867,271 B2_

THRESHOLD VOLTAGE ADJUSTMENT FOR A SELECT GATE TRANSISTOR IN A STACKED NON-VOLATILE MEMORY DEVICE

BACKGROUND OF THE INVENTION

1. Field of the Invention

The present invention relates to techniques for configuring a 3D non-volatile memory device.

2. Description of the Related Art

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

BRIEF DESCRIPTION OF THE DRAWINGS

Like-numbered elements refer to common components in the different figures.

FIG. 2C depicts a cross-sectional view of the portion 210 of the block 200 of FIG. 2A, along line 220.

FIG. 2D depicts a close-up view of the region 236 of the column C0 of FIG. 2C, showing a drain-side select gate SGD0 and a memory cell MC303.

FIG. 2E depicts a cross-sectional view of the column C0 of FIG. 2D along line 295.

FIG. 3C depicts an example of the SGD line subset SGDL-SB0 of FIG. 2A, consistent with FIGS. 3A and 3B.

FIG. 4C depicts a cross-sectional view of the portion 488 of the block 480 of FIG. 4A along line 486.

FIG. 6A depicts an embodiment of the process of FIG. 5A in which the SGD transistors are read, after which programming and then erasing occurs.

FIG. 6B depicts an embodiment of the process of FIG. 5A in which the SGD transistors are read to identify a low Vth, after which programming occurs, after which the SGD transistors are read to identify a high Vth, after which erasing occurs.

FIG. 7 depicts an embodiment of step 508 of the process of FIG. 5A in which programming of the SGD transistors occurs.

FIG. 8 depicts an embodiment of step 508 of the process of FIG. 5A in which erasing of the SGD transistors occurs.

FIG. 11A depicts example voltages (Vsgd) for the control gates of selected SGD transistors (Vsgd_sel) and unselected SGD transistors (Vsgd_unsel).

FIG. 11B depicts example voltages for selected bit lines (Vbl_sel) in communication with selected SGD transistors, and unselected bit lines (Vbl_unsel) in communication with unselected SGD transistors.

FIG. 11C depicts example voltages for a word line (Vwl), select line (Vsl), back gate (Vbg) and SGS transistor (Vsgs).

FIG. 11D depicts a pillar voltage (Vpillar) for a selected SGD transistor.

FIG. 11E depicts a Vth of a SGD transistor being erased.

FIG. 12A depicts example voltages (Vsgd) for the control gates of selected SGD transistors (Vsgd_sel).

FIG. 12B depicts example voltages for selected bit lines (Vbl_sel) in communication with selected SGD transistors, and unselected bit lines (Vbl_unsel) in communication with unselected SGD transistors.

FIG. 12C depicts example voltages for a word line (Vwl), select line (Vsl), back gate (Vbg), a SGS transistor (Vsgs), and an unselected SGD transistor (Vsgd_unsel).

FIG. 12D depicts a pillar voltage (Vpillar) for a selected SGD transistor.

FIG. 12E depicts a Vth of a SGD transistor being programmed.

FIG. 13A depicts example voltages during the read operations of FIG. 6D.

FIG. 13B depicts a selected bit line voltage during sensing of a SGD transistor.

FIG. 13C depicts example voltages for a word line (Vwl), back gate (Vbg) and an SGS line (Vsgs).

DETAILED DESCRIPTION

Figure 1A:
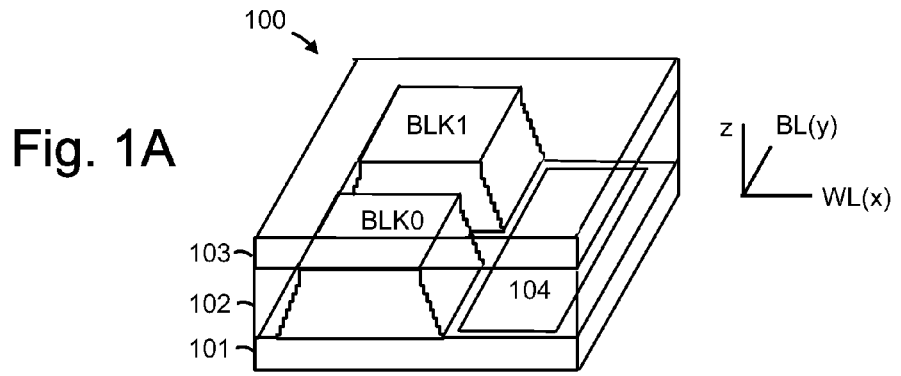
FIG. 1A is a perspective view of a 3D stacked non-volatile memory device.

A 3D stacked non-volatile memory device includes strings of series-connected memory cells. A drain end of the string is connected to a bit line and has a select gate, drain (SGD) transistor which controls whether the bit line communicates with the memory cells. A source end of the string is connected to a source line and has a select gate, source (SGS) transistor which controls whether the source line communicates with the memory cells. For example, the SGD and SGS transistors can be controlled according to whether erasing, programming or sensing operations are to be performed on the memory string.

The SGD transistors have a control gate voltage Vsgd which has to be within a specified window or range. To program memory cells in a string, the drain end of the string is connected to a bit line voltage Vbl_mc_pgm ("M" denotes "bit line," "mc" denotes "memory cell" "pgm" denotes "program") which is grounded (0 V) or set to a relatively low non-zero voltage which allows programming to occur (e.g., 0.5-1.0 V). Vsgd should be sufficiently high to make the SGD transistor conductive and pass this bit line voltage to the memory cells. For example, Vsgd>Vbl_mc_pgm+Vth, where Vth is the threshold voltage of the SGD transistor. To inhibit a string from programming, the SGD transistor is made non-conductive. The drain end of the string is connected to a bit line voltage which is set to a relatively high non-zero voltage Vbl_mc_inhibit (e.g., Vdd, a power supply voltage such as 2-3 V) which inhibits programming from occurring. Vsgd should be low enough so that the SGD transistor is made non-conductive. This requires Vsgd<Vbl_mc_inhibit+Vth.

However, the Vth can vary for different SGD transistors due to normal process variations. The Vth of different SGD transistors typically has a distribution about a median value. To maximize the Vsgd window, the Vth distribution should be a narrow as possible. The Vth can be adjusted by process variations during fabrication, e.g., variations in physical dimensions such as recess step, body thickness and radius, and variations in drain implantation/doping. However, the effectiveness of such process variations is limited and they are difficult and expensive to control. These are aspects of device engineering. Moreover, the Vth distribution can vary over time as additional program-erase cycles are experienced by the memory device.

Techniques provided herein allow evaluation and adjustment of the Vth of a SGD transistor independent of the device engineering. In one approach, the evaluation and adjustment are performed initially during the die sort (wafer sort), when the memory chips are tested while on the wafer, before packaging and installation in an end user device such as a camera, cell phone, digital audio player or laptop. The end user device is operated by the end user, e.g., a person. The evaluation can involve reading the SGD transistors at lower and upper levels of an acceptable range. The SGD transistors for which the Vth is below the lower level can be subject to programming, and the SGD transistors for which the Vth is above the upper level can be subject to erasing. The SGD transistors for which the Vth is within the acceptable range can be unchanged. In one approach, the SGD transistors are arranged in SGD subsets such as sub-blocks, where each SGD transistor in a SGD subset is connected to a common SGD control line and therefore receives a common voltage. A block can include multiple SGD subsets. The evaluation and adjustment can occur one subset at a time, in one approach. Further, conditions can be defined for repeating the evaluation and adjustment, such as the occurrence of a specified number of program-erase cycles of an associated sub-block, other subset or block of the memory device. In another option, the condition is different for different SGD transistors or groups of SGD transistors.

Aspects include programming SGD transistors with verify and inhibit, erasing SGD transistors with verify and inhibit, and both of the above.

In the discussion below, FIGS. 1A-4D provide structural details of a 3D stacked non-volatile memory device, and FIGS. 5-13C provide flowcharts, Vth voltage distributions and voltage waveforms.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
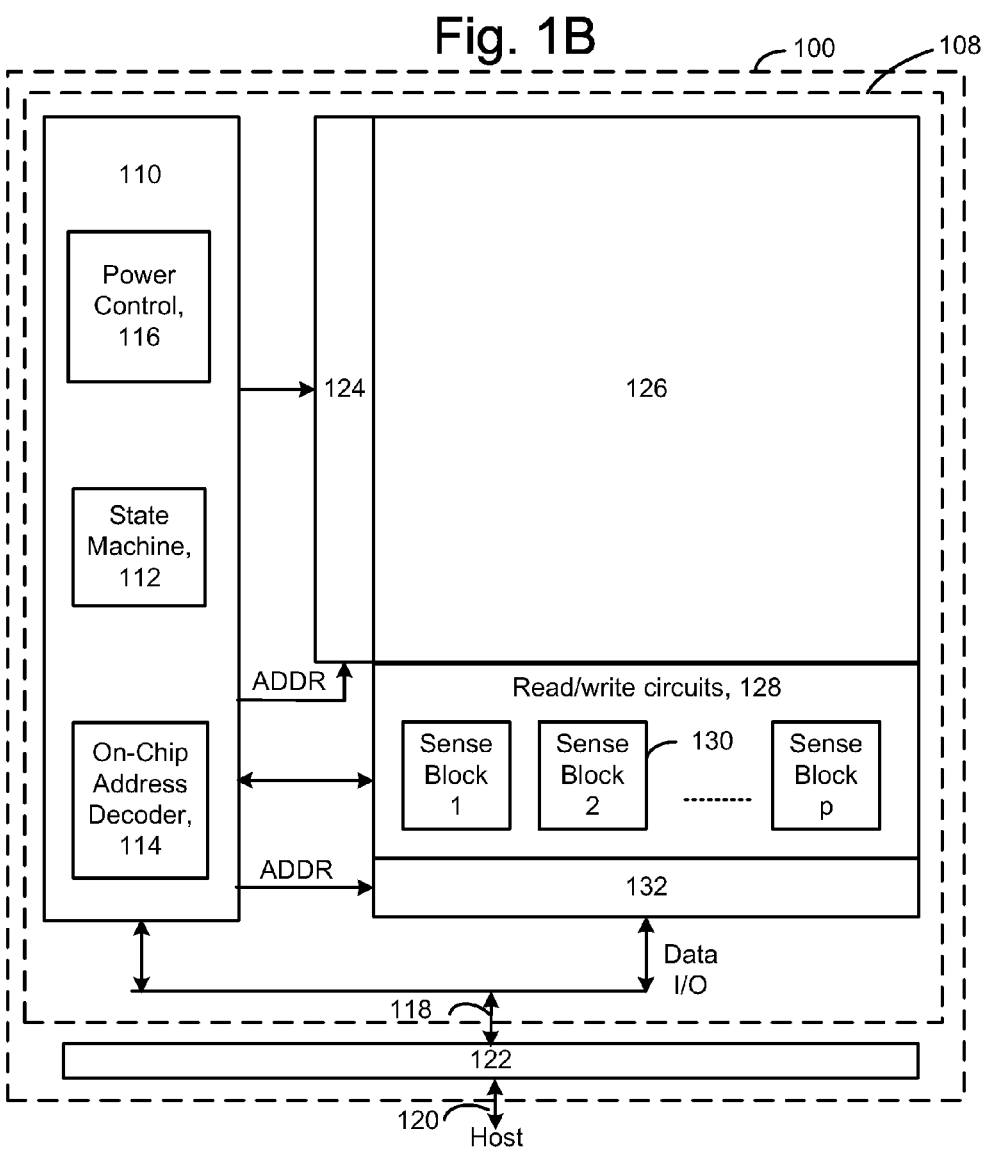
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) memory array of storage elements 126, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of storage elements to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers and word line layer portions, drain- and source-side select gate drivers (referring, e.g., to drain- and source-sides or ends of a string of memory cells such as a NAND string, for instance) and source lines. The sense blocks 130 can include bit line drivers, in one approach.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control 116, sense blocks 130, read/write circuits 128, and controller 122, and so forth.

In another embodiment, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half Thus, the row decoder is split into two row decoders and the column decoder into two column decoders. Similarly, the read/write circuits are split into read/write circuits connecting to bit lines from the bottom and read/write circuits connecting to bit lines from the top of the array 126. In this way, the density of the read/write modules is reduced by one half.

Other types of non-volatile memory in addition to NAND flash memory can also be used.

Figure 2A:
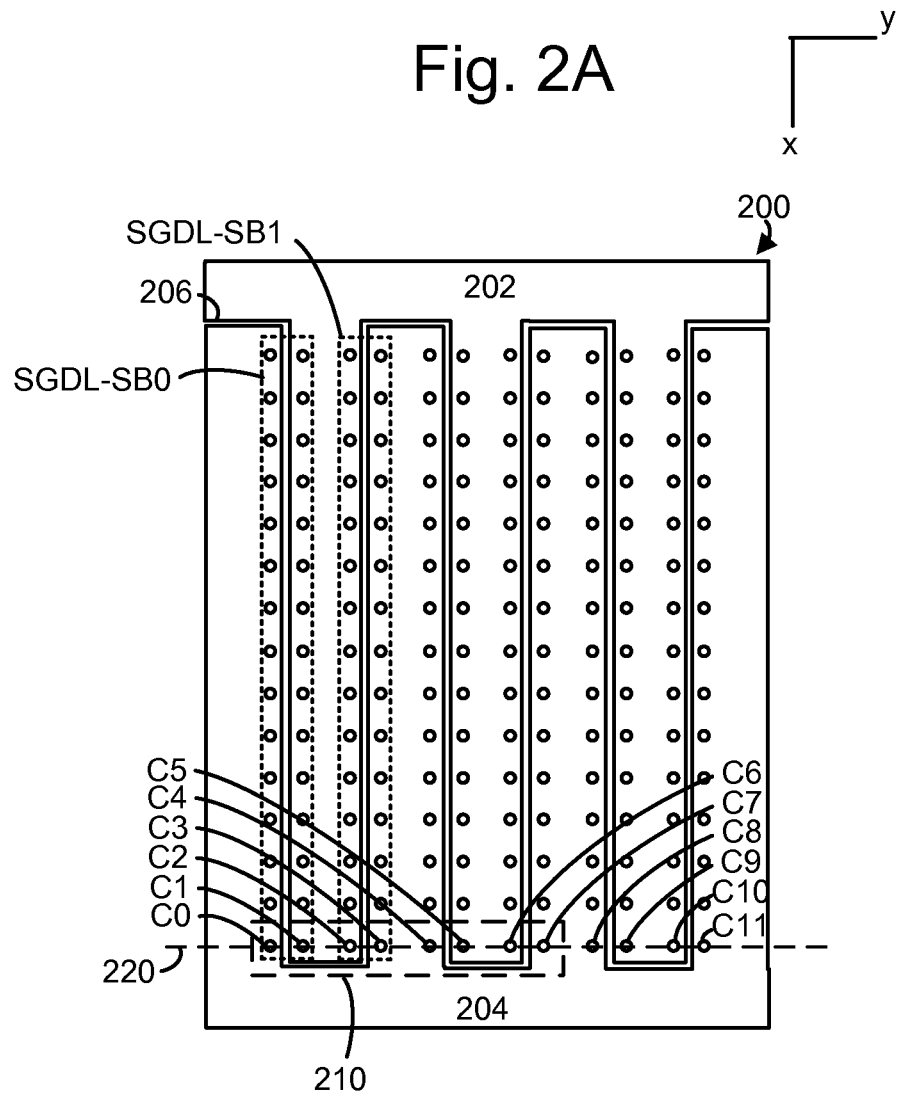
FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple word line layers in a stack. Referring also to FIG. 2C, the stack includes alternating dielectric and conductive layers. The dielectric layers include D0 to D5 and may be made of SiO2, for instance. The conductive layers include BG, which is a back gate layer, WL0 to WL3, which form word line layers, e.g., conductive paths to control gates of the memory cells at the layer, and SG, which forms a select gate layer, e.g., a conductive path to control gates of select gate transistors of NAND strings. The word line layer of FIG. 2A may represent any one of WL0 to WL3, for instance. The conductive layers may include doped polysilicon or metal silicide, for instance. An example voltage of 5-10 V (Vbg) may be applied to the back gate to maintain a conductive state which connects the drain- and source-side columns.

For each block, the word line layer is divided into two word line layer portions 202 and 204. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the word line layer portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The strings of memory cells can be arranged in subsets or sub-blocks.

Subsets of memory strings can be of different types, such as WL subsets, SGD line subsets and BL subsets.

Figure 2B:
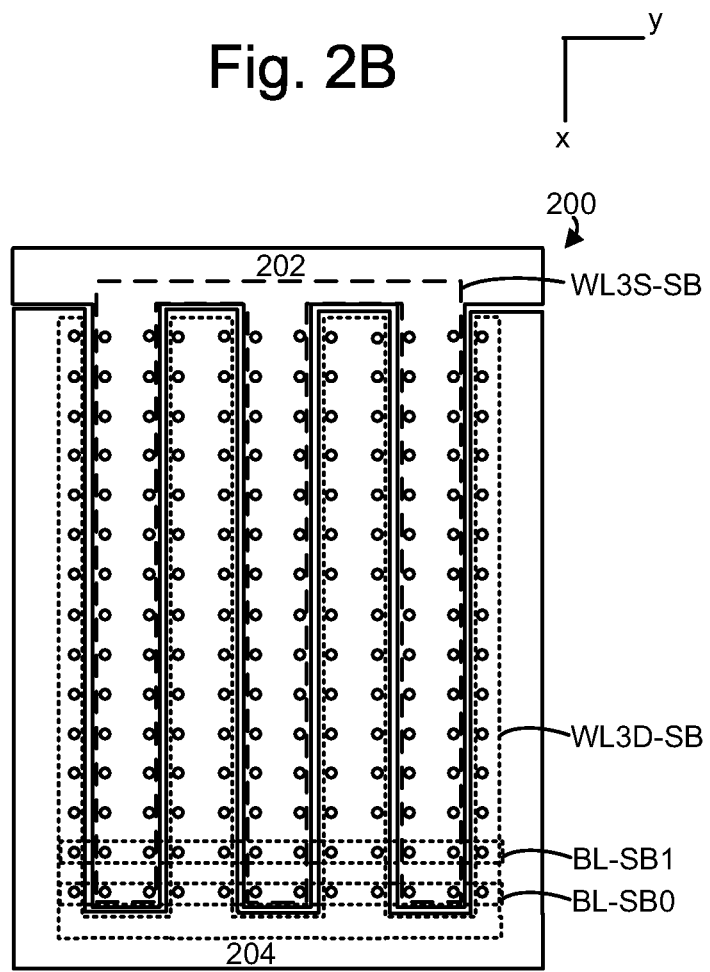
FIG. 2B depicts the block 200 FIG. 2A, showing example word line subsets WL3D-SB and WL3S-SB and example bit line subsets BL-SB0 and BL-SB1.

FIG. 2B depicts the block 200 FIG. 2A, showing example word line subsets WL3D-SB and WL3S-SB and example bit line subsets BL-SB0 and BL-SB1. This example assumes that the WL3 layer is depicted. WL3S-SB is a word line layer or word line layer portion in communication with one (e.g., exactly one) memory cell in the source-side of each U-shaped NAND string, and WL3D-SB is a word line layer or word line layer portion in communication with one (e.g., exactly one) memory cell in the drain-side of each U-shaped NAND string.

Each subset can be independently inhibited from being erased. For example, a WL subset can be independently inhibited from being erased by floating a voltage of the WL. A SGD line subset can be independently inhibited from being erased by setting a voltage of the SGD line to a sufficiently high (but lower than selected BL bias) level which inhibits erase. If Vdg is small enough not to be able to generate GIDL to charge the unselected channels, the unselected SGD line subset can be inhibited from being erased. Similarly, a BL subset can be independently inhibited from being erased by setting a voltage of the BL to a sufficiently low level which inhibits erase. The term "inhibit erase" or the like refers, e.g., to substantially preventing or not encouraging erase. A "subset" as used herein generally refers to a proper subset. A subset "A" is a proper subset of a set "B" when A⊂B and A≠B. That is, A contains one or more cells which are also contained within B, but A does not contain all cells in B. A contains fewer memory cells than B. Subsets of the same type typically are distinct from one another and do not contain common cells. Subsets of different types can contain one or more common cells.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the word line layer portions 202 and 204.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assume there are four memory cells per column, so there are 384 k×4=1,536 k or 1,536,000 total cells in the set.

A portion 210 of the block 200 is described further below in connection with FIG. 3A.

FIG. 2C depicts a cross-sectional view of the portion 210 of the block 200 of FIG. 2A, along line 220. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263. NS0 has a drain end 232 and a source end 240. NS1 includes columns C2 and C3 and connecting portion 264. NS1 has a drain end 244 and a source end 242. NS2 includes columns C4 and C5 and connecting portion 265. NS3 includes columns C6 and C7 and connecting portion 266.

The source line SL0 is connected to the source ends 240 and 242 of two adjacent memory strings NS0 and NS1. The source line SL0 is also connected to other sets of memory strings which are behind NS0 and NS1 in the x direction. Recall that additional U-shaped NAND strings in the stack 230 extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit portion 206 from FIG. 2A is also depicted as an example. In the cross-section, multiple slit portions are seen, where each slit portion is between the drain- and source-side columns of a U-shaped NAND string. A portion of the bit line BL0 is also depicted.

Short dashed lines depict memory cells and select gate transistors, as discussed further below. A region 236 of the stack is shown in greater detail in FIG. 2D.

FIG. 2D depicts a close-up view of the region 236 of the column C0 of FIG. 2C, showing a drain-side select gate transistor SGD0 and a memory cell MC303. The region shows portions of the dielectric layers D3 to D5 and the conductive layers WL3 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 296, a nitride such as SiN as a charge trapping layer can be deposited as layer 297, a tunnel oxide can be deposited as layer 298, a polysilicon body or channel can be deposited as layer 299, and a core filler dielectric can be deposited as region 300. Additional memory cells are similarly formed throughout the columns.

When a memory cell is programmed, electrons are stored in a portion of the charge trapping layer which is associated with the memory cell. For example, electrons are represented by "−" symbols in the charge trapping layer 297 for MC303. These electrons are drawn into the charge trapping layer from the polysilicon body, and through the tunnel oxide. The threshold voltage of a memory cell is increased in proportion to the amount of stored charge.

During an erase operation, a voltage in the polysilicon body (Vpillar) is raised due to gate-induced drain leakage (GIDL), as mentioned, while a voltage of one or more selected word line layers floats. The voltage of the one or more selected word line layers is then driven down sharply to a low level such as 0 V to create an electric field across the tunnel oxide which causes holes to be injected from the memory cell's body to the charge trapping layer, resulting in a large Vth downshift toward an erase-verify level, Vv-erase. This process can be repeated in successive iterations until a verify condition is met, as discussed further below. For unselected word lines, the word lines are floated but not driven down to a low level so that the electric field across the tunnel oxide is relatively small, and no, or very little, hole tunneling will occur. Memory cells of the unselected word lines will experience little or no Vth downshift, and as a result, they will not be erased.

SGD transistors can also be programmed or erased in a similar manner as the memory cells, as discussed further below. When a SGD transistor is programmed, electrons are stored in a portion of the charge trapping layer which is associated with the memory cell. For example, electrons are represented by "−" symbols 289 in the charge trapping layer 297 for MC303.

FIG. 2E depicts a cross-sectional view of the column C0 of FIG. 2D. Each layer is ring-shaped in one possible approach, except the core filler, which is cylindrical.

Figure 3A:
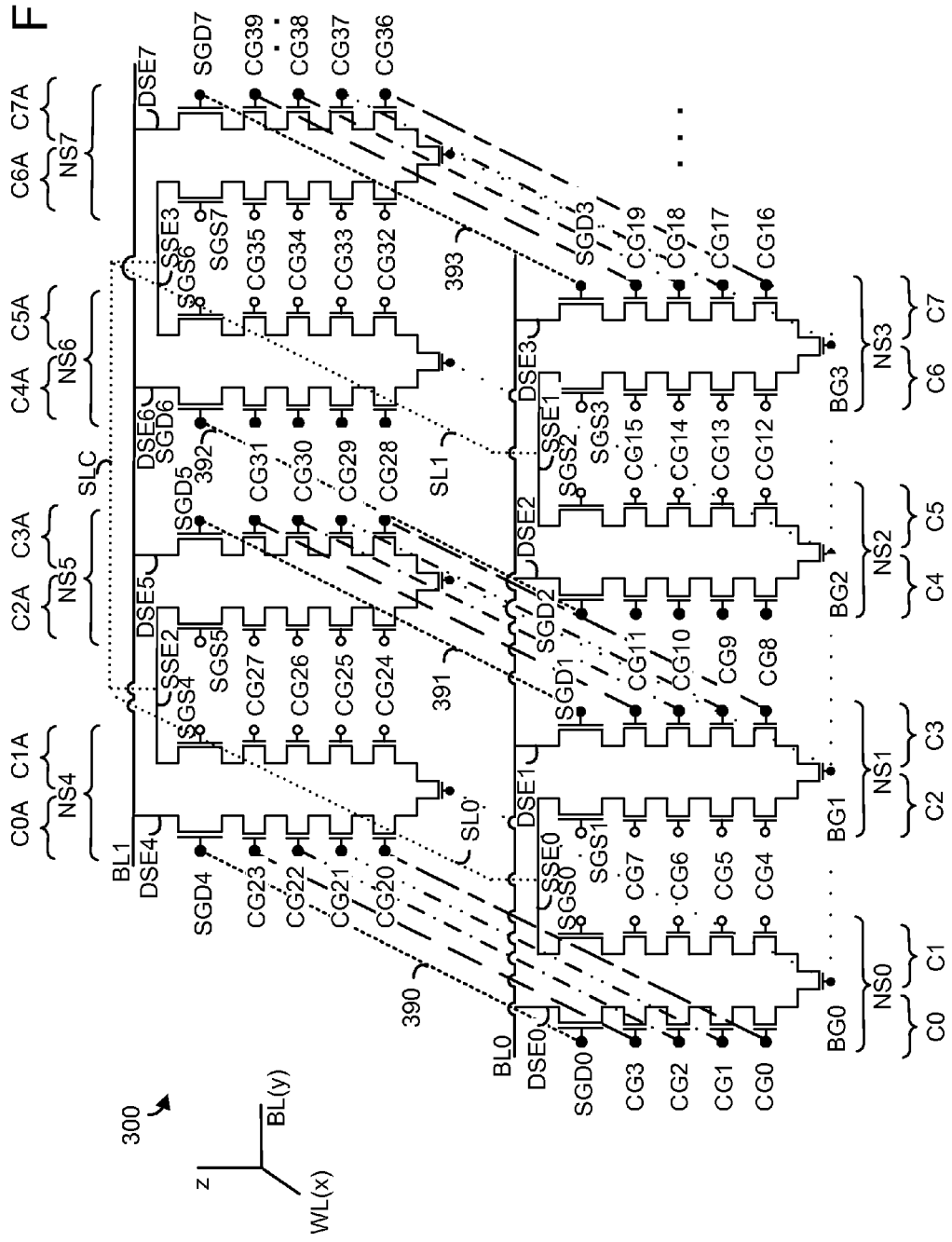
FIG. 3A depicts one embodiment of a circuit 300 showing electrical connections between drain-sides of U-shaped NAND strings, consistent with the portion 210 of the block of FIG. 2A.

FIG. 3A depicts one embodiment of a circuit 300 showing electrical connections between drain-sides of U-shaped NAND strings, consistent with the portion 210 of the block of FIG. 2A. A number of NAND strings NS0 to NS3 are in communication with a bit line BL0, and a number of NAND strings NS4 to NS7 are in communication with a bit line BL1. Each NAND string has a drain-side column with four memory cells and a SGD transistor, and a source-side column with four memory cells and a SGS transistor. For example, on the drain-side, NS0 has CG0-CG3 and SGD0, NS1 has CG8-CG11 and SGD1, NS2 has CG8-CG11 and SGD2, NS3 has CG16-CG19 and SGD3, NS4 has CG20-CG23 and SGD4, NS5 has CG28-CG31 and SGD5, NS6 has CG28-CG31 and SGD6, and NS7 has CG36-CG39 and SGD7. On the source-side, NS0 has CG4-CG7 and SGS0, NS1 has CG4-CG7 and SGS1, NS2 has CG12-CG15 and SGS2, NS3 has CG12-CG15 and SGS3, NS4 has CG24-CG27 and SGS4, NS5 has CG24-CG27 and SGS5, NS6 has CG32-CG35 and SGS6, and NS7 has CG32-CG35 and SGS7. The drain-side columns are C0, C3, C4, C7, C0A, C3A, C4A and C7A for NS0-NS7, respectively. The source-side columns are C1, C2, C5, C6, C1A, C2A, C5A and C6A for NS0-NS7, respectively.

Further, each NAND string has a source-side end (SSE0 shared by NS0 and NS1, SSE1 shared by NS2 and NS3, SSE2 shared by NS4 and NS5, and SSE3 shared by NS6 and NS7) and a drain side end (DSE0 of NS0, DSE1 of NS1, DSE2 of NS2, DSE3 of NS3, DSE4 of NS4, DSE5 of NS5, DSE6 of NS6, and DSE7 of NS7). Each NAND string has a back gate (BG0 for NS0, BG1 for NS1, BG2 for NS2, and BG3 for NS3). The back gates may be connected to one another. A source line SL0 connects SSE0 and SSE2, and a source line SL1 connects SSE1 and SSE3. Optionally, a source line connector (SLC) connects SL0 and SL1. Typically, for one-sided erase, the source lines are tied together and the SLC is used. For two-sided erase, the source lines are not tied together and the SLC is not used.

Control gates (CG) of the drain-side memory cells are connected to one another by word line layers. For example, CG0-CG3 are connected to CG20-CG23, respectively, CG8-CG11 are connected to CG28-CG31, respectively, and CG16-CG19 are connected to CG36-CG39, respectively. Control gates (CG) of the source-side memory cells are also connected to one another by word line layers. For example, CG4-CG7 are connected to CG24-CG27, respectively, and CG12-CG15 are connected to CG32-CG35, respectively.

Additionally, the drain-side control gates of memory cells at a given level of the stacked 3D memory device are connected to one another. For example, CG0, CG8, CG16, CG20, CG28 and CG36 are connected to one another at the first word line level (WL0). CG1, CG9, CG17, CG21, CG29 and CG37 are connected to one another at the second word line level (WL1). CG2, CG10, CG18, CG22, CG30 and CG38 are connected to one another at the third word line level (WL2). CG3, CG11, CG19, CG23, CG31 and CG39 are connected to one another at the fourth word line level (WL3).

Additionally, SGD transistor control gates are connected to one another in respective SGD line subsets. For example, SGD0 is connected by SGD line 390 to SGD4, SGD1 is connected by SGD line 391 to SGD5, SGD2 is connected by SGD line 392 to SGD6, and SGD3 is connected by SGD line 393 to SGD6.

In one implementation, SGD transistors in a SGD line subset, e.g., in communication with a common SGD line, are independent from SGD transistors in other SGD line subsets. For example, SGD0 and SGD4 are independent from SGD1 and SGD5, from SGD2 and SGD6 and from SGD3 and SGD6. One or more selected SGD transistors in a SGD line subset can be programmed or erased concurrently.

Additionally, the source-side control gates of memory cells at a given level of the stacked 3D memory device are connected to one another. For example, CG4, CG12, CG24 and CG32 are connected to one another at the first word line level (WL0). CG5, CG13, CG25 and CG33 are connected to one another at the second word line level (WL1). CG6, CG14, CG26 and CG34 are connected to one another at the third word line level (WL2). CG7, CG15, CG27 and CG35 are connected to one another at the fourth word line level (WL3).

Figure 3B:
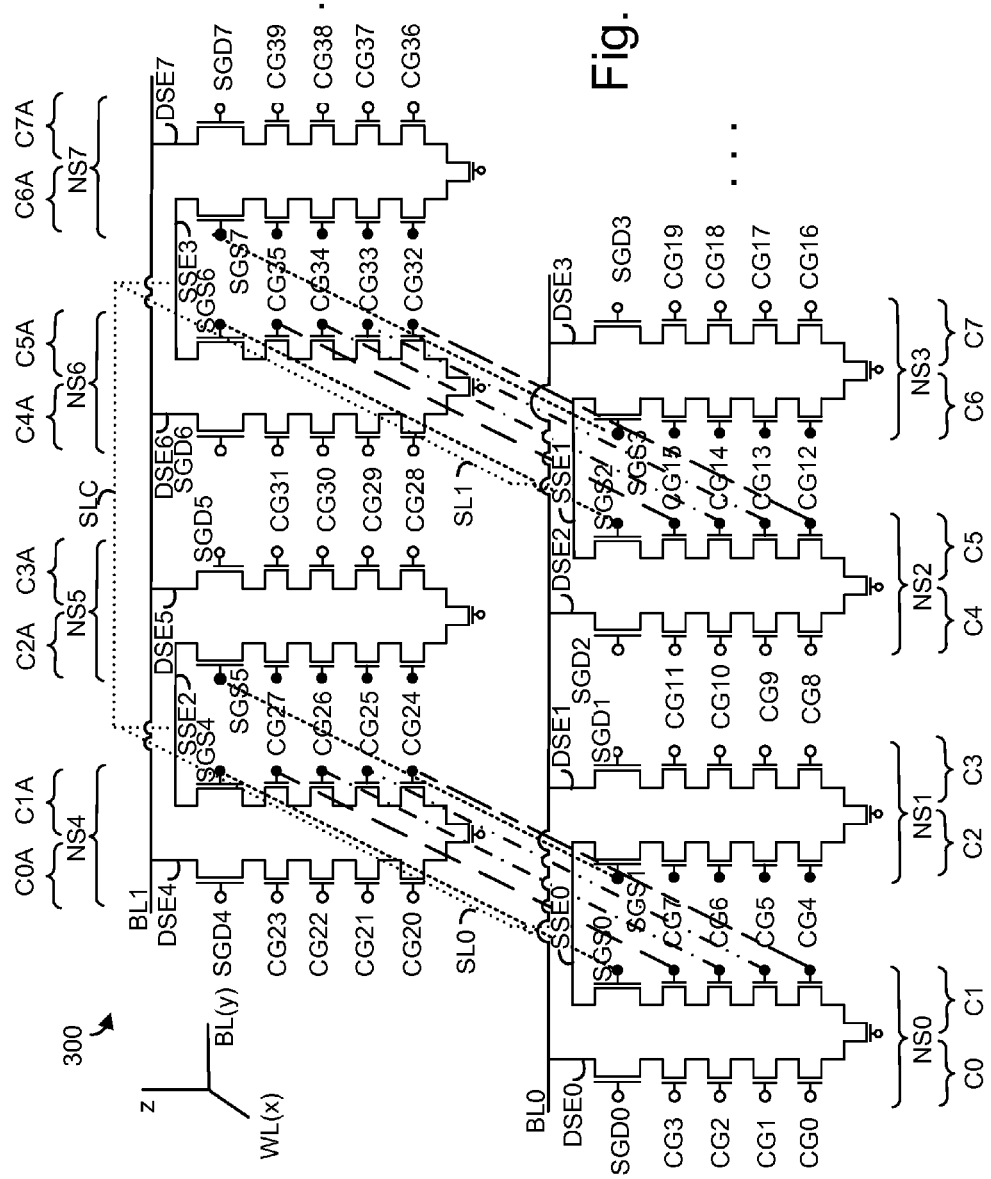
FIG. 3B depicts one embodiment of connections between source-sides of U-shaped NAND strings, consistent with the circuit of FIG. 3A.
Figure 3D:
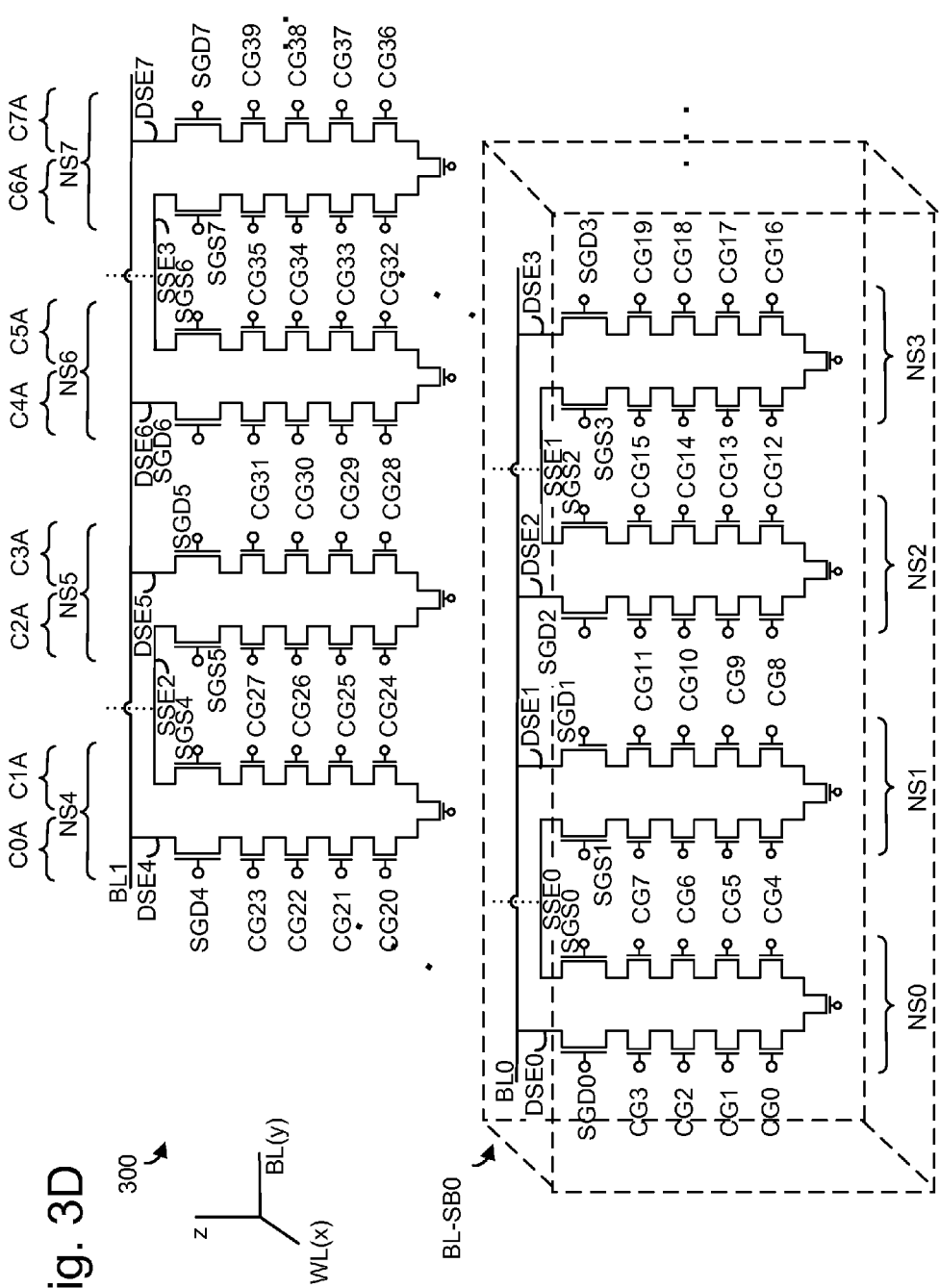
FIG. 3D depicts an example of the bit line subset BL-SB0 of FIG. 2B, consistent with FIGS. 3A and 3B.
Figure 3E:
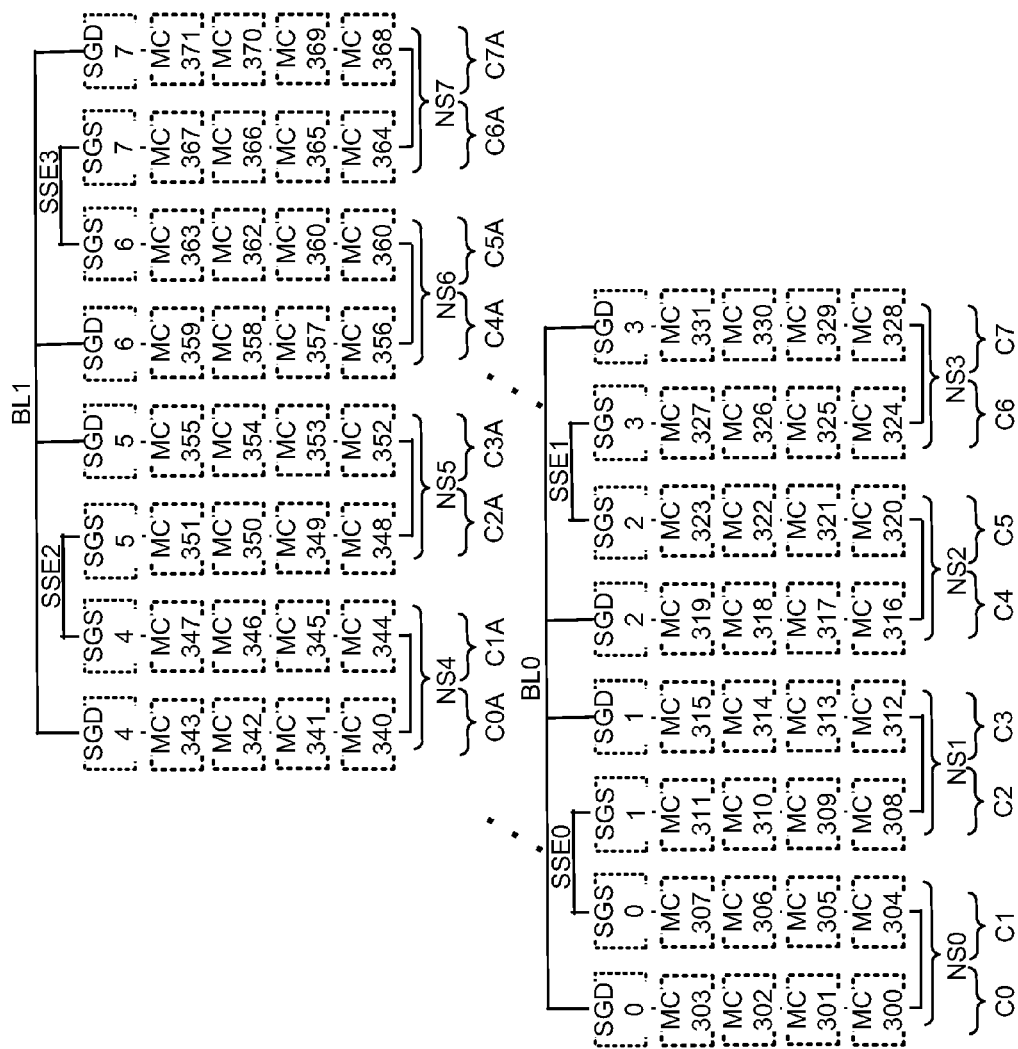
FIG. 3E depicts an example arrangement of memory cells consistent with the circuit of U-shaped NAND strings of FIGS. 3A and 3B.

The control gates are associated with memory cells as can be seen by referring also to FIG. 3E. Specifically, CG0-CG3 are associated with MC300-MC303, respectively. CG4-CG7 are associated with MC304-MC307, respectively, and MC308-MC311, respectively. CG8-CG11 are associated with MC312-MC315, respectively, and MC316-MC319, respectively. CG12-CG15 are associated with MC320-MC323, respectively, and MC324-MC327, respectively. CG16-CG19 are associated with MC328-MC321, respectively. Furthermore, CG20-CG23 are associated with MC340-MC343, respectively. CG24-CG27 are associated with MC344-MC347, respectively, and MC348-MC351, respectively. CG28-CG31 are associated with MC352-MC355, respectively, and MC356-MC359, respectively. CG32-CG35 are associated with MC360-MC363, respectively, and MC364-MC367, respectively. CG36-CG39 are associated with MC368-MC371, respectively.

The dark circles indicate drain-side control gates of memory cells and SGD transistors. FIG. 3B depicts one embodiment of connections between source-sides of U-shaped NAND strings, consistent with the circuit of FIG. 3A.

SGS transistor control gates are connected to one another in the x-direction. For example, SG50 is connected to SGS4, SGS1 is connected to SGS5, SGS2 is connected to SGS6, and SGS3 is connected to SGS7. The dark circles indicate source-side control gates of memory cells and SGS transistors.

The circuit connections of FIGS. 3A and 3B are shown separately for clarity but are provided in a common circuit.

FIG. 3C depicts an example of the SGD line subset SGDL-SB0 of FIG. 2A, consistent with FIGS. 3A and 3B. This subset includes NAND strings which are associated with one (e.g., exactly one) SGD line, e.g., NS0 and NS4 (and any additional NAND strings between them). Other example SGD line subsets can be provided by NS1 and NS5 (and any additional NAND strings between them) in communication with SGD line 391, NS2 and NS6 (and any additional NAND strings between them) in communication with SGD line 392, and NS3 and NS7 (and any additional NAND strings between them) in communication with SGD line 393.

In other words, a SGD line subset includes NAND strings whose SGD transistors are in communication with one (e.g., exactly one) SGD line. The NAND strings of a SGD line subset can be inhibited together from being erased by control of the SGD line. For example, in SGDL-SB0, NS0 and NS4 can be inhibited by controlling SGD line 390.

The NAND strings of one SGD line subset can be inhibited independently from the NAND strings of another SGD line subset. The SGD line is in communication with the SGD transistor of each NAND string in the SGD line subset and can inhibit erase such as by setting a voltage which does not allow GIDL to occur and charge the channel of the NAND string when a bit line voltage is applied to a drain-side end of the NAND strings. For example, SGD line 390 is in communication with SGD0 and SGD4 and can therefore set a voltage at the control gates of these select gate transistors. A SGD transistor can be thought of as a gate between the bit line and the channel of the NAND string.

For example, assume a first SGD line subset has an uninhibited status and is therefore not inhibited from being erased in a current erase iteration, and a second SGD line subset has an inhibited status and is therefore inhibited from being erased in the current erase iteration. When an erase voltage is applied to a bit line to erase SGD transistors in NAND strings of the first SGD line subset, the SGD line of the first SGD line subset can be controlled to allow charging of the channels of the NAND strings in the first SGD line subset, while the SGD line of the second SGD line subset can be controlled to prevent or discourage charging of the channels of the NAND strings in the second SGD line subset.

FIG. 3D depicts an example of the bit line subset BL-SB0 of FIG. 2B, consistent with FIGS. 3A and 3B.

This subset includes NAND strings which are in communication with one (e.g., exactly one) bit line. The NAND strings of a BL subset can be inhibited together from being erased by control of the BL. The NAND strings of one BL subset can be inhibited independently from the NAND strings of another BL subset. The BL is in communication with the drain-side end of each NAND string in the BL subset and can inhibit erase such as by setting a voltage which does not allow GIDL to occur and charge the channel of the NAND string when a bit line voltage is applied. For example, in the bit line subset BL-SB0, BL0 is in communication with DSE0 to DSE3 but not DSE4 to DSE7. In another bit line subset, BL1 is in communication with DSE4 to DSE7 but not DSE0 to DSE3.

For example, assume a first BL subset (associated with BL0) has an uninhibited status and is therefore not inhibited from being erased in a current erase iteration, and a second BL subset (associated with BL1) has an inhibited status and is therefore inhibited from being erased in the current erase iteration. A sufficiently high erase voltage is applied to BL0 to allow charging of the channels of the NAND strings in the first BL subset, while a lower voltage is applied to BL1 to substantially prevent or discourage charging of the channels of the NAND strings in the second BL subset.

FIG. 3E depicts an example arrangement of memory cells consistent with the circuit of U-shaped NAND strings of FIGS. 3A and 3B, as discussed. See also the discussion of FIG. 3B.

Figure 4A:
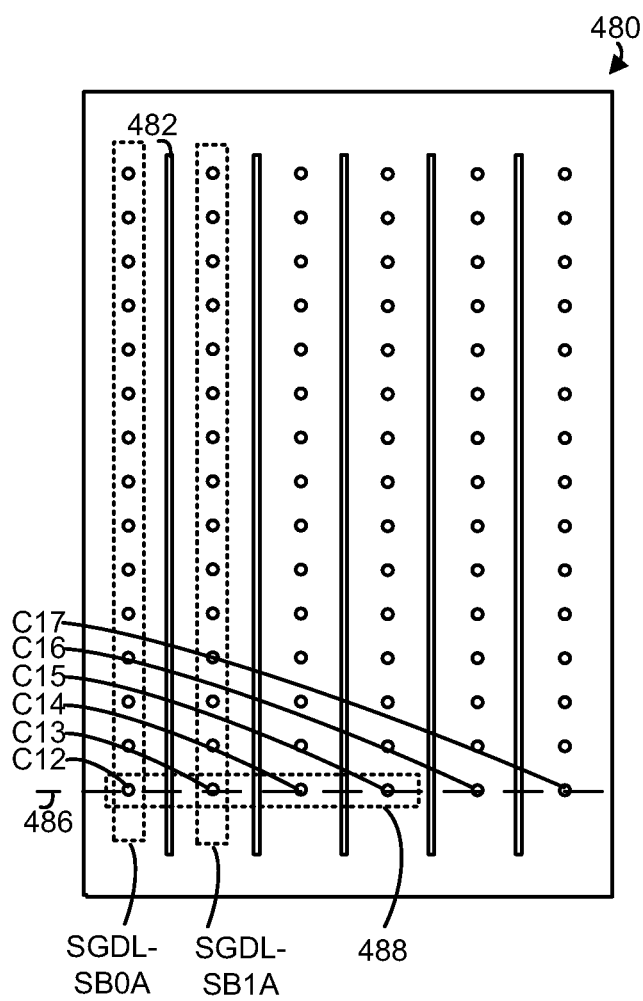
FIG. 4A depicts a top view of a straight NAND string embodiment 480 of the block BLK0 of FIG. 1A, showing example SGD line subsets SGDL-SB0A and SGDL-SB1A and example bit line subsets.
Figure 4B:
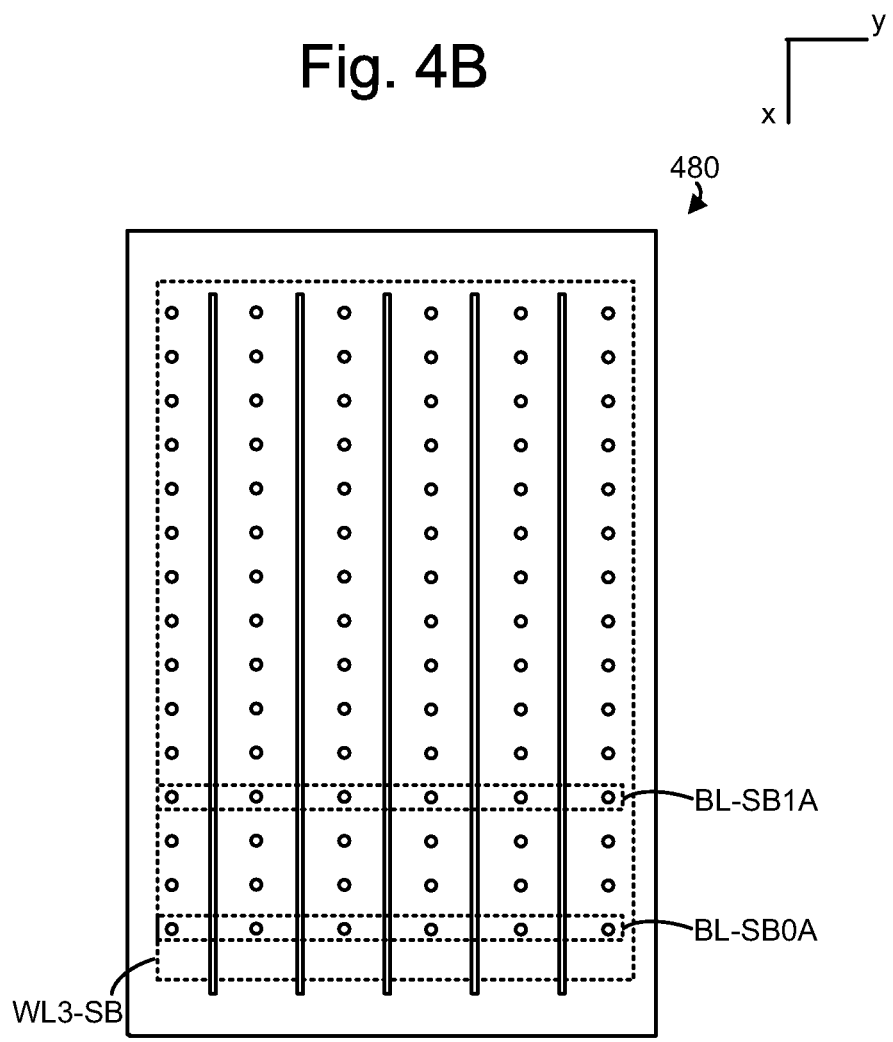
FIG. 4B depicts the block BLK0 of FIG. 4A, showing an example WL line subset WL3-SB and example bit line subsets BL-SB0A and BL-SB1A.

FIG. 4A depicts a top view of a straight NAND string embodiment 480 of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, FIG. 4B depicts the block BLK0 of FIG. 4A, showing an example WL line subset WL3-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4C depicts a cross-sectional view of the portion 488 of the block 480 of FIG. 4A along line 486. Columns of memory cells corresponding to NAND strings NS8 to NS11 are depicted in the multi-layer stack. The stack 490 includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS8 has a source end 494 and a drain end 492. The slit 482 from FIG. 4A is also depicted with other slits. A portion of the bit line BL0A is also depicted. Dashed lines depict memory cells and select gate transistors.

Figure 4D:
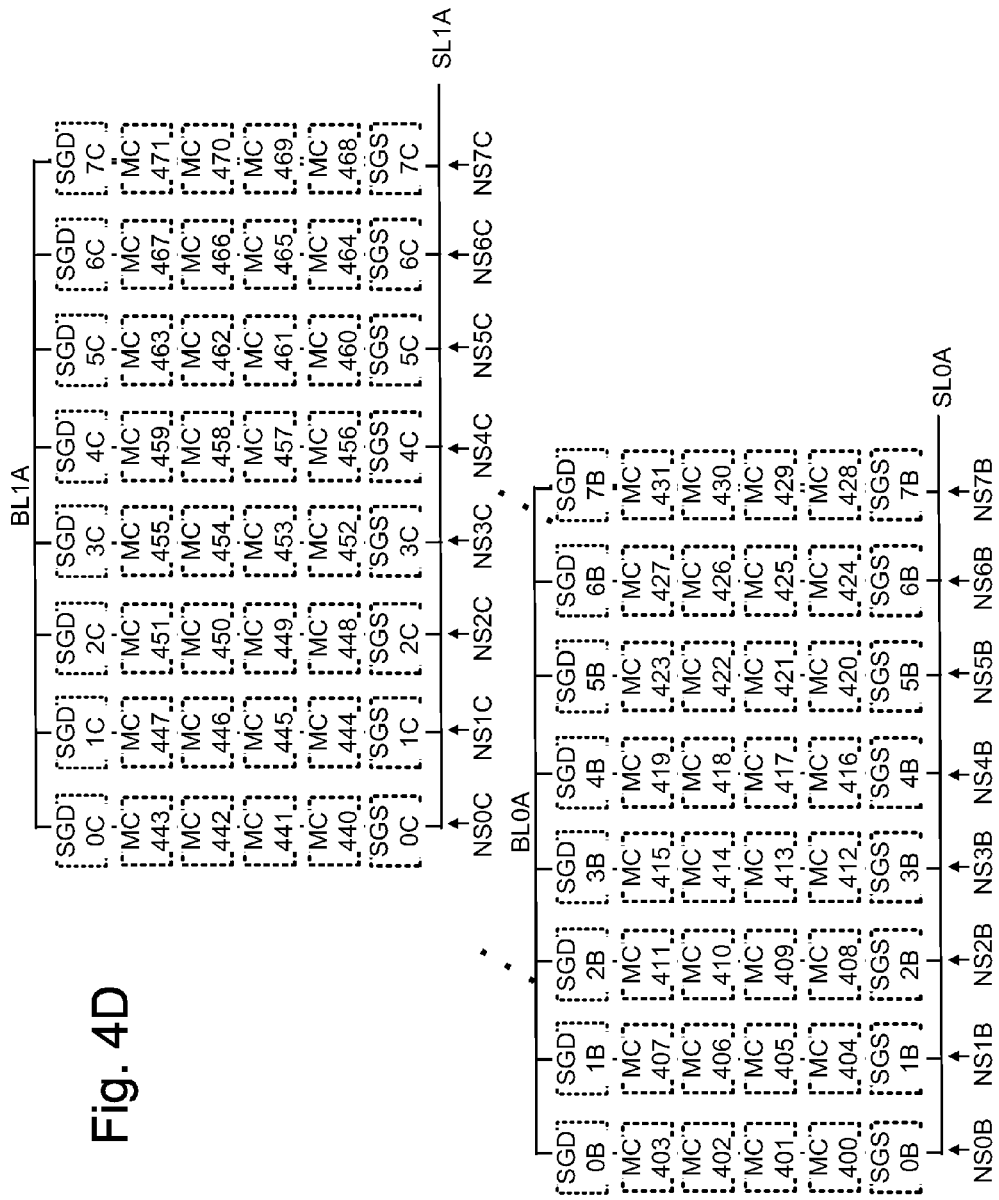
FIG. 4D depicts an example arrangement of memory cells consistent with the circuit of straight NAND strings of FIG. 4A.

FIG. 4D depicts an example arrangement of memory cells consistent with the circuit of straight NAND strings of FIG. 4A. One example bit line subset is represented by the memory cells of the NAND strings NS0B-NS7B which are in communication with a bit line BL0A and a source line SL0A, and another example bit line subset is represented by the memory cells of the NAND strings NS0C-NS7C which are in communication with a bit line BL1A and a source line SL1A. In one bit line subset, the NAND strings and their memory cells are: NS0B (MC400-MC403), NS1B (MC404-MC407), NS2B (MC408-MC411), NS3B (MC412-MC415), NS4B (MC416-MC419), NS5B (MC420-MC423), NS6B (MC424-MC427), and NS7B (MC428-MC431). In the other bit line subset, the NAND strings and their memory cells are: NS0C (MC440-MC443), NS1C (MC444-MC447), NS2C (MC448-MC451), NS3C (MC452-MC455), NS4C (MC456-MC459), NS5C (MC460-MC463), NS6C (MC464-MC467), and NS7C (MC468-MC471).

Further, eight example SGD line subsets are represented by NS0B and NS0C (and any NAND strings between them), NS1B and NS1C (and any NAND strings between them), NS2B and NS2C (and any NAND strings between them), NS3B and NS3C (and any NAND strings between them), NS4B and NS4C (and any NAND strings between them), NS5B and NS5C (and any NAND strings between them), NS6B and NS6C (and any NAND strings between them), and NS7B and NS7C (and any NAND strings between them).

Each NAND string includes a SGD transistor between its memory cells and the bit line, and a SGS transistor between its memory cells and the source line. The SGD and SGS transistors for the NAND strings are: NS0B (SGD0C and SGS0C), NS1B (SGD1C and SGS1C), NS2B (SGD2C and SGS2C), NS3B (SGD3C and SGS3C), NS4B (SGD4C and SGS4C), NS5B (SGD5C and SGS5C), NS6B (SGD6C and SGS6C), NS7B (SGD7C and SGS7C), NS0C (SGD0C and SGS0C), NS1C (SGD1C and SGS1C), NS2C (SGD2C and SGS2C), NS3C (SGD3C and SGS3C), NS4C (SGD4C and SGS4C), NS5C (SGD5C and SGS5C), NS6C (SGD6C and SGS6C), and NS7C (SGD7C and SGS7C).

Figure 5A:
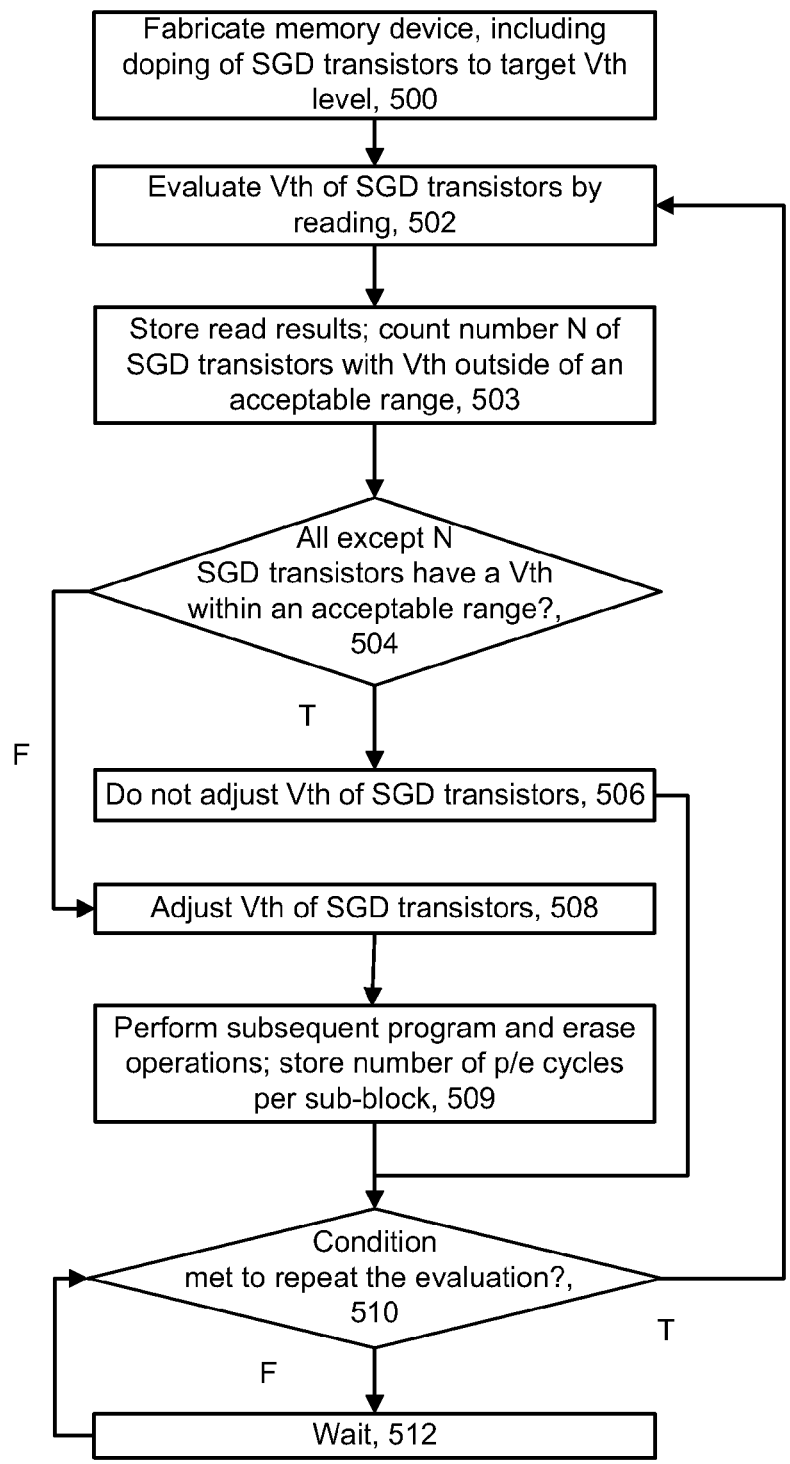
FIG. 5A depicts a process for evaluating and adjusting the threshold voltage (Vth) of SGD transistors.

FIG. 5A depicts a process for evaluating and adjusting the Vth of SGD transistors. As mentioned at the outset, a technique for adjusting the Vth of SGD transistors independently of device processes is advantageous because it can narrow the Vth distribution and allow periodic readjustments. The steps include: Fabricate memory device, including doping of SGD transistors to target Vth level, 500; Evaluate Vth of SGD transistors by reading, 502 (also reached if decision step 510 is true); Store read results; count number N of SGD transistors with Vth outside of an acceptable range, 503; All except N SGD transistors have a Vth within an acceptable range?, 504; Do not adjust Vth of SGD transistors, 506 (reached if decision step 504 is true (T)); Adjust Vth of SGD transistors, 508 (reached if decision step 504 is false (F)); Perform subsequent program and erase operations; store number of p/e cycles per sub-block, 509; Condition met to repeat the evaluation?, 510; and Wait, 512 (reached if decision step 510 is false).

Step 502 can include reading a set of SGD transistors at control gate voltages (compare points) for upper (Vth_max) and lower (Vth_min) boundaries of an acceptable range of Vth. See FIG. 6D for further details.

Step 504 indicates that it may be acceptable to avoid adjusting the Vth when some natural number of N=0 or more SGD transistors do not have a Vth within the acceptable range. For example, no adjustment is needed if decision step 504 is true in the first pass of FIG. 5A. Or, no further adjustment is needed if decision step 504 is true in the second or later pass of FIG. 5A. In one approach, the programming of the SGD transistors is considered to be successfully completed when a number of the SGD transistors subject to the programming whose threshold voltage is not verified to have reached the acceptable range is below a specified number N, and/or the erasing the SGD transistors is considered to be successfully completed when a number of the SGD transistors subject to the erasing whose threshold voltage is not verified to have reached the acceptable range is below a specified number N. The specified number for programming and erase can be the same or different.

The condition for initiating a repeat of the process starting at step 502 can be fixed, or adaptive to the SGD transistors. Moreover, a repeat can be made for an individual SGD transistor, or a set of SGD transistors such as a sub-block, other subset of a block or a full block.

Step 510 indicates that the evaluation and adjustment (if needed) can be repeated when a condition is met such as a number of program-erase cycles occurring in an associated sub-block, other subset of a block or a full block (step 509). This is appropriate since the Vth will typically degrade with increasing program-erase cycles. The SGD transistors degrade mainly due to the programming interference from the neighboring word line, and hot carrier injection from GIDL during erase. To keep track of this degradation, we can store a count of the program/erase cycling number of the block or sub-block associated with the SGD line. One characterization of the memory device indicated that the upper tail may degrade. That is, the Vth distribution of a set of SGD transistors may tend to become skewed toward higher Vth values.

Thus, the performing the adjustment process for the SGD transistors can be repeated once, or multiple times, when an associated sub-block, other subset of a block or a full block of the 3D stacked non-volatile memory device has undergone one or multiple specified numbers of program-erase cycles. An example process involves counting a number of program-erase cycles in the 3D stacked non-volatile memory device, and repeating the evaluation and/or adjustment process for the SGD transistors based on the counting.

In another option, the condition of step 510 is met when there are a certain number of correctable errors in a set of memory cells. The method can include programming memory cells of the memory strings, reading the memory cells using an error correction code, determining a number of correctable errors based on the reading of the memory cells, and if the number of correctable errors exceeds a threshold number, a performing of an adjustment process for the SGD transistors is triggered. The fact that there are more than a threshold number of correctable errors is an indication that a repeat of the evaluation and adjustment process may be needed. In fact, this repeat may help in reducing the number of errors in the future.

Figure 5B:
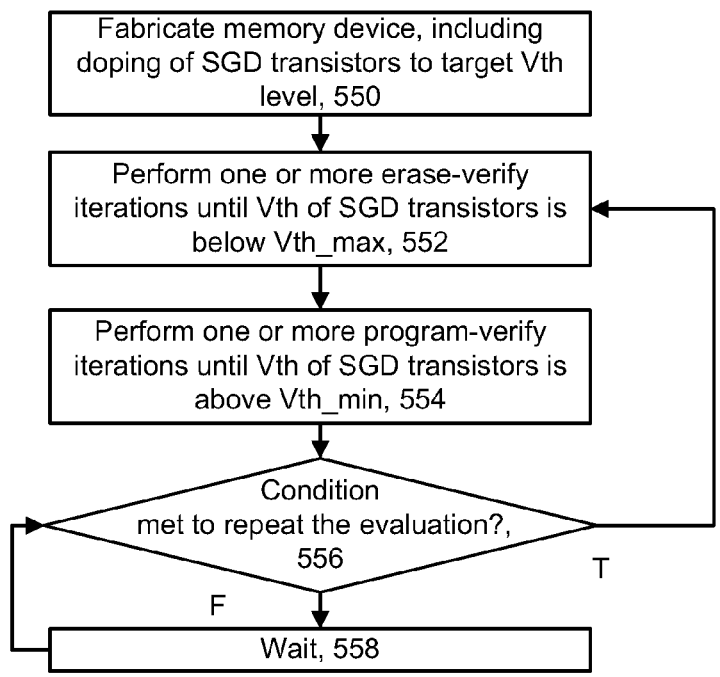
FIG. 5B depicts another process for evaluating and adjusting the Vth of SGD transistors in which an erase operation is followed by a programming operation, with no initial evaluation of the Vth distribution.

FIG. 5B depicts another process for evaluating and adjusting the Vth of SGD transistors in which an erase operation is followed by a programming operation, with no initial evaluation of the Vth distribution. The steps include: Fabricate memory device, including doping of SGD transistors to target Vth level, 550; Perform one or more erase-verify iterations until Vth of SGD transistors is below Vth_max, 552; Perform one or more program-verify iterations until Vth of SGD transistors is above Vth_min, 554; Condition met to repeat the evaluation?, 556; and Wait, 558.

Figure 5C:
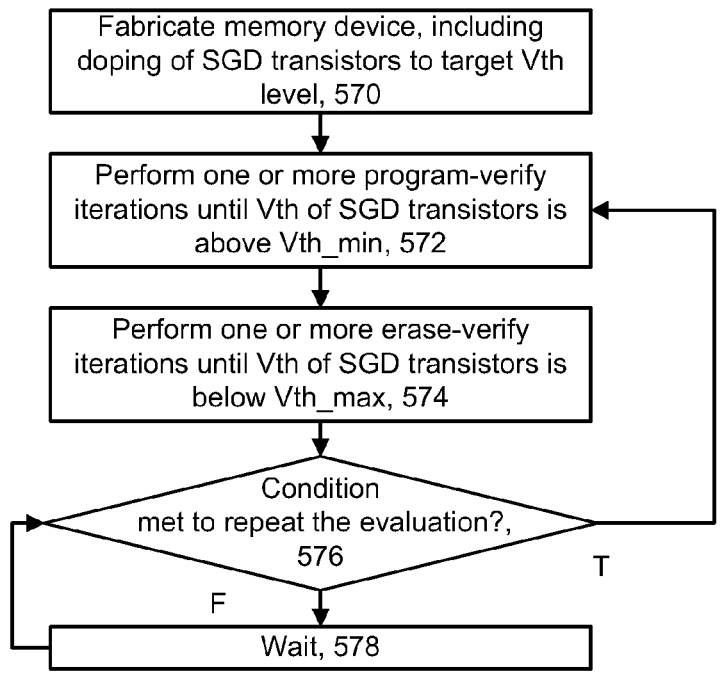
FIG. 5C depicts another process for evaluating and adjusting the Vth of SGD transistors in which a programming operation is followed by an erase operation, with no initial evaluation of the Vth distribution.

FIG. 5C depicts another process for evaluating and adjusting the Vth of SGD transistors in which a programming operation is followed by an erase operation, with no initial evaluation of the Vth distribution. The steps include: Fabricate memory device, including doping of SGD transistors to target Vth level, 570; Perform one or more program-verify iterations until Vth of SGD transistors is above Vth_min, 572; Perform one or more erase-verify iterations until Vth of SGD transistors is below Vth_max, 574; Condition met to repeat the evaluation?, 576; and Wait, 578.

In the approaches of FIGS. 5B and 5C, the time which would otherwise be needed to perform the initial evaluation of the Vth distribution is not used. Instead, each SGD transistor is subject to at least one program or erase iteration. The maximum time for the adjustment process is controlled by the SGD transistor which requires the greatest number of program or erase iterations. For instance, assume four program iterations are needed. The fact that all SGD transistors are programmed during the first program iteration does not increase the overall programming time. The initial program or erase iteration can use a relatively weak program or erase pulse to avoid an excessive movement of the Vth of a SGD transistor which is in the acceptable range. A higher Vbl can also be used to weaken the first programming iteration.

Various aspects of FIG. 5A-5C are discussed below.

FIG. 6A depicts an embodiment of the process of FIG. 5A in which the SGD transistors are read, after which programming and then erasing occurs. The steps include: Begin adjustment operation for SGD transistors, 600; Read the SGD transistors at a lower control gate voltage Vth_min, 602; Store read results identifying SGD transistors for which the Vth is below Vth_min, 604; Read the SGD transistors at an upper control gate voltage Vth_max, 606; Store read results identifying SGD transistors for which the Vth is above Vth_max, 608; Based on stored data, program SGD transistors for which the Vth is below Vth_min, 610; Based on stored read results, erase SGD transistors for which the Vth is above Vth_max, 612; and End of adjustment operation for SGD transistors, 614. In this approach, the SGD transistors for which the Vth is below or above the acceptable range is determined. Subsequently, programming occurs for SGD transistors having a Vth below the acceptable range, and erasing occurs for SGD transistors having a Vth above the acceptable range. Or, erasing may occur before programming for a given set of SGD transistors.

FIG. 6B depicts an embodiment of the process of FIG. 5A in which the SGD transistors are read to identify a low Vth, after which programming occurs, after which the SGD transistors are read to identify a high Vth, after which erasing occurs. The steps include: Begin adjustment operation for SGD transistors, 620; Read the SGD transistors at a lower control gate voltage Vth_min, 622; Store read results identifying SGD transistors for which the Vth is below Vth_min, 624; Based on stored data, program SGD transistors for which the Vth is below Vth_min, 626; Read the SGD transistors at an upper control gate voltage Vth_max, 628; Store read results identifying SGD transistors for which the Vth is above Vth_max, 630; Based on stored read results, erase SGD transistors for which the Vth is above Vth_max, 632; and End of adjustment operation for SGD transistors, 634.

In this approach, the SGD transistors for which the Vth is below the acceptable range are determined and these SGD transistors are programmed. Subsequently, the SGD transistors for which the Vth is above the acceptable range are determined and these SGD transistors are erased. This approach may be advantageous in case of over-programming or when the programming results in an increase in the Vth of other SGD transistors, causing their Vth to move above the acceptable range. Due to the read at step 628 occurring after the programming of step 626, the erasing will encompass these SGD transistors to move them back into the acceptable range, in addition to the other SGD transistors for which the Vth was initially determined to be above the acceptable range. It is also conceivable that a SGD transistor may be programmed from a Vth below the acceptable range to a Vth above the acceptable range, depending on factors such as the width of the acceptable range and the programming pulse amplitude and step size, and characteristics of the SGD transistor. Due to the read at step 628 occurring after the programming of step 626, the erasing will encompass these SGD transistors and may be able to move them into the acceptable range.

Figure 6C:
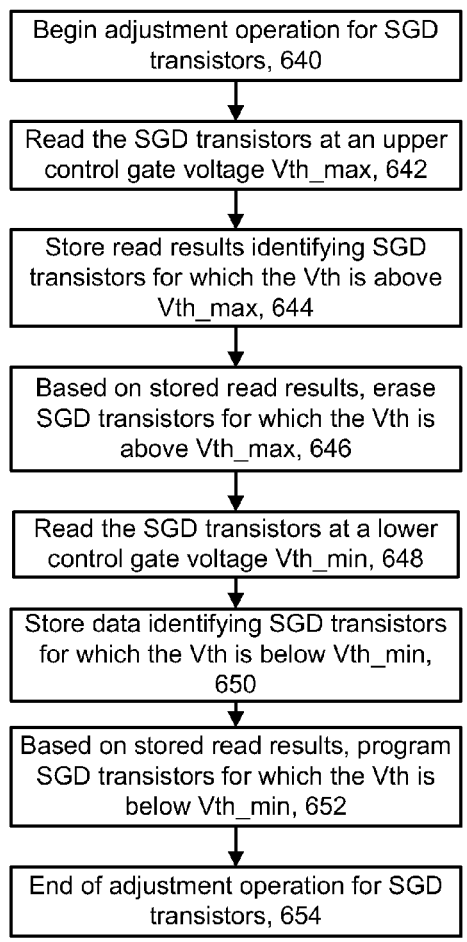
FIG. 6C depicts an embodiment of the process of FIG. 5A in which the SGD transistors are read to identify a high Vth, after which erasing occurs, after which the SGD transistors are read to identify a low Vth, after which programming occurs.

FIG. 6C depicts an embodiment of the process of FIG. 5A in which the SGD transistors are read to identify a high Vth, after which erasing occurs, after which the SGD transistors are read to identify a low Vth, after which programming occurs. The steps include: Begin adjustment operation for SGD transistors, 640; Read the SGD transistors at an upper control gate voltage Vth_max, 642; Store read results identifying SGD transistors for which the Vth is above Vth_max, 644; Based on stored read results, erase SGD transistors for which the Vth is above Vth_max, 646; Read the SGD transistors at a lower control gate voltage Vth_min, 648; Store data identifying SGD transistors for which the Vth is below Vth_min, 650; Based on stored read results, program SGD transistors for which the Vth is below Vth_min, 652; and End of adjustment operation for SGD transistors, 654.

In this approach, the SGD transistors for which the Vth is above the acceptable range is determined and these SGD transistors are erased. Subsequently, the SGD transistors for which the Vth is below the acceptable range is determined and these SGD transistors are programmed. This approach may be advantageous in case of over-erasing or when the erasing results in a decrease in the Vth of other SGD transistors, causing their Vth to move below the acceptable range. Due to the read at step 648 occurring after the erasing of step 646, the programming will encompass these SGD transistors to move them back into the acceptable range, in addition to the other SGD transistors for which the Vth was initially determined to be below the acceptable range. It is also conceivable that a SGD transistor may be erased from a Vth above the acceptable range to a Vth below the acceptable range, depending on factors such as the width of the acceptable range and the erase pulse amplitude and step size, and characteristics of the SGD transistor. Due to the read at step 648 occurring after the erasing of step 646, the programming will encompass these SGD transistors and may be able to move them into the acceptable range.

Figure 6D:
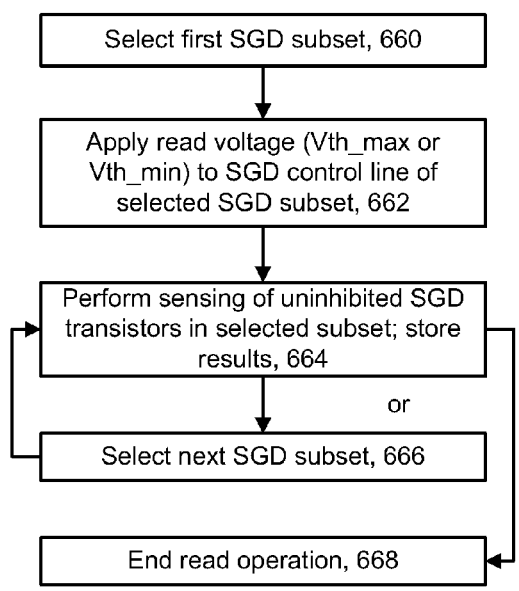
FIG. 6D depicts an embodiment of step 502 of the process of FIG. 5A in which the SGD transistors are read.

FIG. 6D depicts an embodiment of step 502 of the process of FIG. 5A in which the SGD transistors are read. The steps include: Select first SGD subset, 660; Apply read voltage (Vth_max or Vth_min) to SGD control line of selected SGD subset, 662; Perform sensing of uninhibited SGD transistors in selected subset; store results, 664; Select next SGD subset, 666; and End read operation, 668. Step 666 or 668 is reached after step 664. In this case, the evaluation and adjustment occur one subset at a time. An option is to read multiple subsets, one at a time, in the evaluation step, then perform the adjustment step, one subset at time. A data storage capability for read results can be provided by the state machine 112 of FIG. 1B, for instance. The ability to identify individual SGD transistors which have a Vth below the acceptable range, within the acceptable range, or above the acceptable range can be provided.

FIG. 7 depicts an embodiment of step 508 of the process of FIG. 5A in which programming of the SGD transistors occurs. The steps include: Select first SGD subset, 700; Select next SGD subset or end programming operation, 702; Begin program portion of program-verify iteration, 704; Access stored read results to determine which SGD transistors are to be programmed, 706; Access stored verify results (after first iteration) to determine which SGD transistors have completed programming, 708; Apply Vpgm to SGD control line for selected SGD subset, drive or float other SGD control lines, set Vbl_sgd_pgm on any bit line in communication with any SGD transistor being programmed, and set Vbl_sgd_inhibit on other bit lines, 710; Begin verify portion of program-verify iteration, 712; Apply control gate voltage (e.g., Vth_min) to SGD control line and sense conductive or non-conductive state of SGD transistors being programmed using associated bit lines, and store verify results, 714; All except N SGD transistors pass verify test?, 716; Programming is successful for SGD subset, 718; Vpgm_max reached?, 720; Step up Vpgm, 722; and Programming is unsuccessful for SGD subset, 724. Step 718 is reached if decision step 716 is true. Step 720 is reached if decision step 716 is false. Step 724 is reached if decision step 720 is true. Step 722 is reached if decision step 720 is false. The value "N" can be the same or different in the different figures.

FIG. 8 depicts an embodiment of step 508 of the process of FIG. 5A in which erasing of the SGD transistors occurs. The steps include: Select first SGD subset, 800; Select next SGD subset or end erasing operation, 802; Begin erase portion of erase-verify iteration, 804; Access stored read results to determine which SGD transistors are to be erased, 806; Access stored verify results (after first iteration) to determine which SGD transistors have completed erasing, 808; Apply Vbl_erase to any bit line in communication with a SGD transistor to be erased; set Vbl_sgd_inhibit on other bit lines; drive SGD control line for selected subset; drive or float other SGD control lines; 810; Begin verify portion of erase-verify iteration, 812; Apply control gate voltage (e.g., Vth_max) to SGD control line and sense conductive or non-conductive state of SGD transistors being erased using associated bit lines; store verify results, 814; All except N SGD transistors pass verify test?, 816; Erasing is successful for SGD subset, 818; Verase_max reached?, 820; Step up Verase, 822; and Erasing is unsuccessful for SGD subset, 824. Step 818 is reached if decision step 816 is true. Step 820 is reached if decision step 816 is false. Step 824 is reached if decision step 820 is true. Step 822 is reached if decision step 820 is false.

Figure 9A:
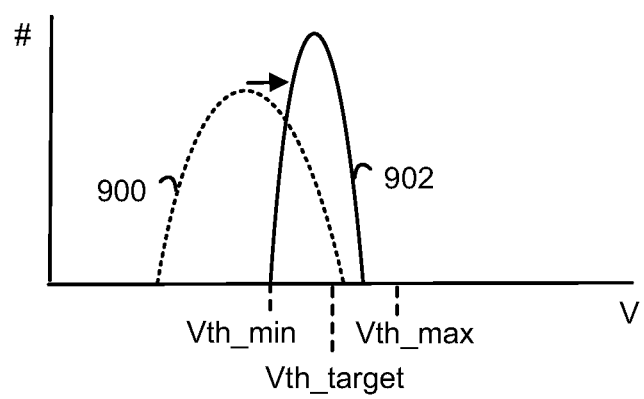
FIG. 9A depicts programming of SGD transistors for which the Vth is below an acceptable range.

FIG. 9A depicts programming of SGD transistors for which the Vth is below an acceptable range. Vth_min is a lower boundary of an acceptable range of Vth value for SGD transistors. Vth_max is an upper boundary of an acceptable range of Vth value for SGD transistors. Vth_target is midway between Vth_min and Vth_max. Curve 900 represents an initial Vth distribution for a set or subset of SGD transistors, such as after the memory device is fabricated and the SGD transistors are doped in an attempt to achieve a median Vth of Vth_target. However, due to various factors, the median of the distribution is below Vth_target. Curve 902 represents the final Vth distribution after programming, where Vth_min is used as a verify level.

Figure 9B:
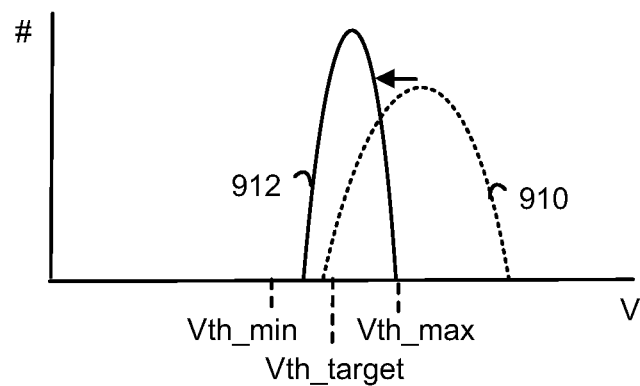
FIG. 9B depicts erasing of SGD transistors for which the Vth is above an acceptable range.

FIG. 9B depicts erasing of SGD transistors for which the Vth is above an acceptable range. Curve 910 represents an initial Vth distribution for a set or subset of SGD transistors. However, due to various factors, the median of the distribution is above Vth_target. Curve 912 represents the final Vth distribution after erasing, where Vth_max is used as a verify level.

Figure 9C:
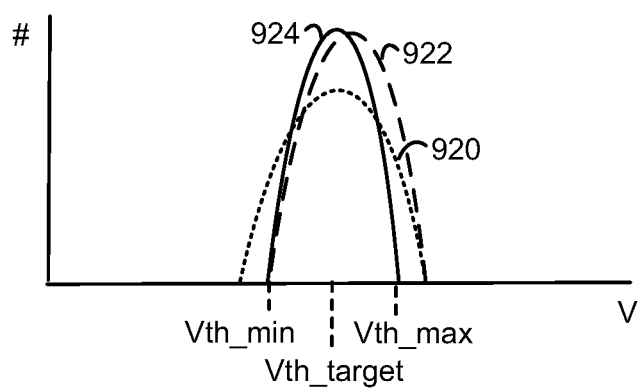
FIG. 9C depicts a Vth distribution of SGD transistors, showing the effects of programming followed by erasing.

FIG. 9C depicts a Vth distribution of SGD transistors, showing the effects of programming followed by erasing. Curve 920 represents an initial Vth distribution for a set or subset of SGD transistors. While the median of the distribution is at Vth_target, the distribution is excessively wide so that significant tails are seen below and above the acceptable range. Curve 922 represents the Vth distribution after programming using Vth_min as a verify level, and curve 924 represents the Vth distribution after erasing using Vth_max as a verify level.

Figure 9D:
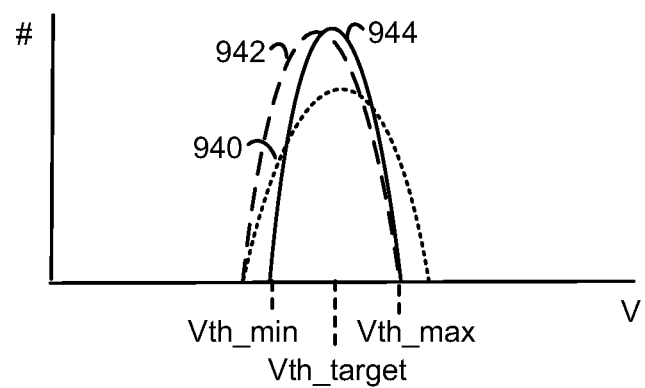
FIG. 9D depicts a Vth distribution of SGD transistors, showing the effects of erasing followed by programming.

FIG. 9D depicts a Vth distribution of SGD transistors, showing the effects of erasing followed by programming. Curve 940 represents an initial Vth distribution for a set or subset of SGD transistors. Curve 942 represents the Vth distribution after erasing using Vth_max as a verify level, and curve 944 represents the Vth distribution after programming using Vth_min as a verify level.

As mentioned at the outset, the Vsgd window is an important characteristic for NAND program operation. In a selected sub-block or subset, a low bias (0 V for normal program and typically ~0.6 V for Quick-Pass-Write programming) is applied on the selected bit lines. Vsgd should be high enough to turn on the SGD transistors and pass this low bias. So, we have Vsgd−Vbl_qpw>Vth_max (Vth_max is the highest value of the Vth of the SGD transistors). Vbl_qpw is an example of Vbl_mc_pgm. Vdd is applied on the unselected bit lines (inhibited bit lines). Vdd is an example of Vbl_mc_inhibit. Vsgd should be low enough to cut off (make non-conductive) the SGD transistors, so we have Vsgd−Vdd<Vth_min (Vth$_{13}$ min is the lowest value of the Vth of the SGD transistors). In an unselected sub-block or subset during data programming, some bit lines are biased as low as 0 V (memory cells associated with those bit lines in the selected sub-blocks are being programmed), and other bit lines are biased at Vdd (memory cells associated with those bit lines in the selected sub-blocks are being inhibited). Vsgd should be low enough to cut off the SGD transistors on all bit lines, so we have Vsgd<Vth_min. Further, considering the larger source/drain lateral field and higher leakage (Vboost vs. 0 V in the un-selected sub-block, and Vboost vs. Vdd for the inhibited bit line in the selected sub-block), studies have found that Vsgd<Vt_min−1 V may be appropriate in some implementations.

The value of Vsgd can be designed separately for selected and unselected sub-blocks. Regarding the Vsgd window on the selected sub-blocks: Vbl_qpw+Vth_max<Vsgd<Vdd+Vth_min. It can be seen that to achieve a maximum Vsgd window, the Vth distribution for the SGD transistors should be as tight as possible.

As mentioned, the SGD Vth might be adjusted by process steps. However, the Vth distribution is difficult to control and tighten within a comparable range as 2D NAND due to process complexities (recess step, body thickness, drain implantation, radius, etc.) Additionally, the upper tail of the SGD Vth might get degraded after cycling. Therefore, it might be difficult to achieve a Vsgd operation window which is comparable to 2D NAND only through process optimization. However, in contrast to 2D NAND, SGD Vth adjustment through programming or erasing is possible in a 3D stacked memory device. Such programming or erasing advantageously allow tightening of the SGD Vth distribution.

Figure 10A:
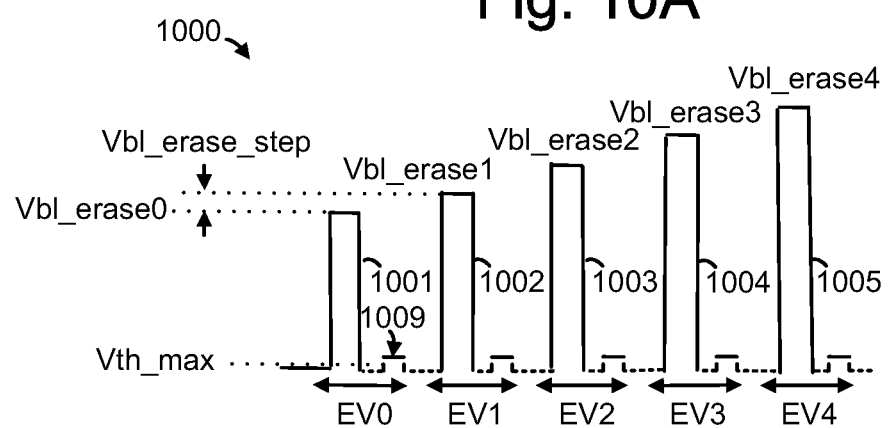
FIG. 10A depicts an example waveform of an erase operation for a SGD transistor.

FIG. 10A depicts an example waveform of an erase operation for a SGD transistor. The waveform depicts a series of erase pulses and verify pulses in an erase operation, where the bit line voltage Vbl_erase is stepped up until a maximum is reached, or until a verify test is passed, at which point the erase operation is concluded. The waveform 1000 represents a number of erase-verify iterations EV0, EV1, EV2, . . . . Each erase-verify iteration includes an erase pulse 1001-1005 followed by a verify pulse such as 1009 of magnitude Vth_max, for instance. In this example, Verase is stepped up in each iteration by a step size Vbl_erase_step. The step size can be uniform or non-uniform. The erase pulses 1001, 1002, 1003, 1004 and 1005 have peak amplitudes of Vbl_erase0, Vbl_erase1, Vbl_erase2, Vbl_erase3 and Vbl_erase4, respectively.

Figure 10B:
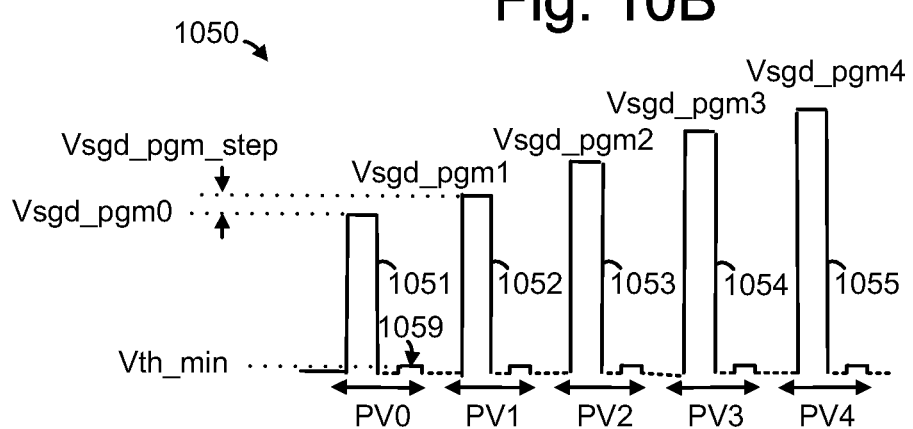
FIG. 10B depicts an example waveform of a programming operation for a SGD transistor.

FIG. 10B depicts an example waveform of a programming operation for a SGD transistor. The waveform depicts a series of program pulses and verify pulses in a programming operation, where the SGD transistor control gate voltage Vsgd_pgm is stepped up until a maximum is reached, or until a verify test is passed, at which point the programming operation is concluded. The waveform 1050 represents a number of program-verify iterations PV0, PV1, PV2, . . . . Each program-verify iteration includes a program pulse 1051-1055 followed by a verify pulse such as verify pulse 1059 of magnitude Vth_min, for instance. In this example, Vsgd_pgm is stepped up in each iteration by a step size Vsgd_pgm_step. The step size can be uniform or non-uniform. The program pulses 1051, 1052, 1053, 1054 and 1055 have peak amplitudes of Vsgd_pgm0, Vsgd_pgm1, Vsgd_pgm2, Vsgd_pgm3 and Vsgd_pgm4, respectively.

FIG. 11A-11E depict example voltages during the erase portion of an erase-verify iteration of the erase operation of FIG. 10A. FIGS. 11A-11E have a common time axis but the time increments are not necessarily equally spaced and the figures are not necessarily to scale.

An erase operation can include multiple erase-verify iterations, e.g., EV0, EV1, EV2, . . . . Each erase-verify iteration can include an erase portion (e.g., pulse or iteration) followed by a verify portion (e.g., pulse or iteration). Each erase pulse is depicted as having a uniform amplitude at a peak level through the pulse for simplicity. Alternatively, the voltage is stepped up to the peak level in one or more steps in an erase pulse. Further, a one-sided erase can be used which applies a voltage to the drain-end of a NAND string via a bit line to charge up the NAND string, while the source-end of the NAND string is not used to charge up the NAND string.

Figure 11A:
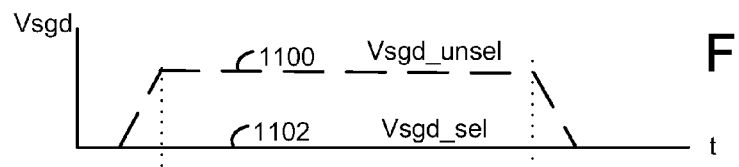
FIG. 11A-11E depict example voltages during the erase portion of an erase-verify iteration of the erase operation of FIG. 10A.

FIG. 11A depicts example voltages (Vsgd) for the control gates of selected SGD transistors (Vsgd_sel) and unselected SGD transistors (Vsgd_unsel). Note that "sel" is shorthand for "selected" and "unsel" is shorthand for "unselected". In one approach, Vsgd_sel (waveform 1102) is driven at Vss=0 V, and Vsgd_unsel (waveform 1100) is floated. Or, Vsgd_unsel can be driven, such as at 8-10 V. A selected and uninhibited SGD transistor is a SGD transistor which is to be erased in an erase iteration. A selected SGD transistor may become inhibited later in the erase operation when it reaches an erase-verify condition. A selected SGD transistor is in a memory string having a drain end in communication with a selected bit line. An inhibited SGD transistor is a SGD transistor which is not to be erased in an erase iteration. An inhibited SGD transistor is in a memory string having a drain end in communication with an unselected bit line.

Figure 11B:
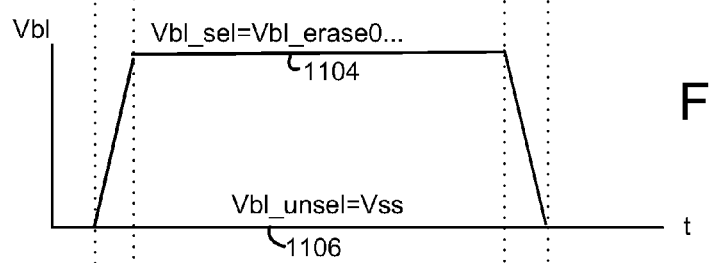

FIG. 11B depicts example voltages for selected bit lines (Vbl_sel) in communication with selected SGD transistors, and unselected bit lines (Vbl_unsel) in communication with inhibited SGD transistors. Vbl_sel (waveform 1104) is set to the amplitude of the current erase pulse, e.g., Vbl_erase0, Vbl_erase1, . . . , and Vbl_unsel (waveform 1106) is driven at Vss. The bit line voltage is ramped up from t0-t1, maintained at a peak level from t1-t2 and ramped down from t2-t3.

Figure 11C:
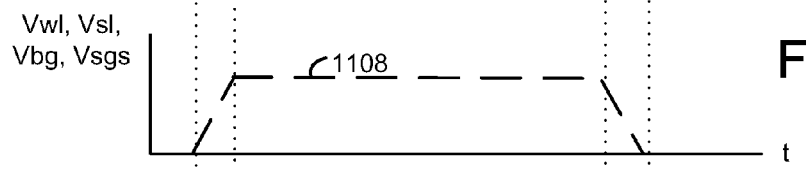

FIG. 11C depicts example voltages for a word line (Vwl), select line (Vsl), back gate (Vbg) and SGS transistor (Vsgs) (Vsgs_sel or Vsgs_unsel). As depicted by waveform 1108, these voltages can be allowed to float. Although one waveform is shown for simplicity, these voltages may float at different respective levels.

Optionally, some or all of these voltages are driven. For example, Vwl and Vbg can be set at a Vpass value of, e.g., 8 V for a selected string. Vsgs_sel and Vsgs_unsel can be driven at 8 V. Vsl can be driven at, e.g., 10 V to cutoff the strings at the source side, such that Vgs (gate-to-source voltage) of the SGS transistor is −2 V. For the selected sub-block, Vsgd_sel is biased at 0 V with the selected bit line at 15-20 V to erase the associated SGD transistors, and with the unselected bit line at, e.g., 8-10 V to inhibit the associated SGD transistors. For the unselected sub-block, Vsgd_sel is biased at 8-10 V with the selected bit line at 15-20 V and the unselected bit line at 8-10 V, so SGD transistors associated with the SGD line are all not erased.

Figure 11D:
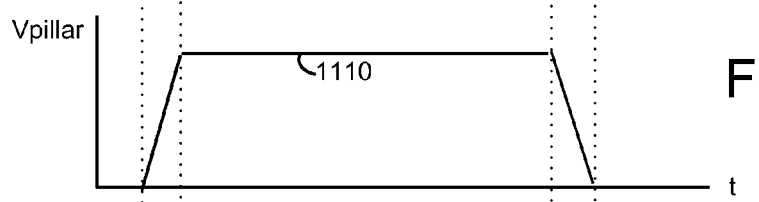

FIG. 11D depicts a pillar voltage (Vpillar) for a selected SGD transistor. As depicted by waveform 1110, Vpillar generally tracks Vbl and can increase due to GIDL current. GIDL current at a select gate is determined by the bias difference (Vdg=Vd−Vg), between the drain voltage (Vd) and the gate voltage (Vg) of the select gate. The GIDL current density can be modeled by: $J=A*Es*exp(-B/Es)$, where Es is the transverse electric field at the surface, and $Es=(Vdg+C)/Tox$. Thus, $J=A'*(Vdg+C)*exp(-B'/(Vdg+C))$, where A', B' and C are constants determined by some physical parameters. Normally, Vdg>>Vth of the select gate to obtain a considerable GIDL current. In some cases, Vdg>2-5 V is needed to generate enough GIDL for an erase pulse width of about one msec.

Figure 11E:
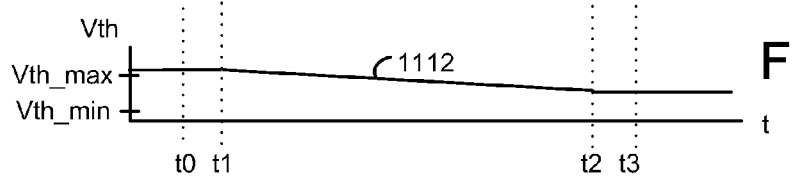

FIG. 11E depicts a Vth of a SGD transistor being erased. As depicted by waveform 1112, the Vth for an example SGD transistor which is being erased is lowered when Vbl is raised from t1-t2. In this case, Vth falls below Vth_max.

As an example, consider that one of the SGD transistors which is selected for erasing is in one of the memory strings (e.g., SGD0 in NS0 in FIG. 3A). The one of the memory strings comprises a select gate, source (SGS) transistor (e.g., SGS0) at a source end thereof, and memory cells (e.g., MC300-MC303, FIG. 3E with control gates CG0-CG3, respectively, FIG. 3A) between the one of the SGD transistors and the SGS transistor, and the drain end of the one of the memory strings is in communication with a bit line (e.g., BL0). The erasing of one of the SGD transistors comprises applying an erase pulse (1104) to the bit line which is sufficiently high (e.g., at least 2-5 V greater than Vsgd_sel) to charge up a channel of the SGD transistor, while driving a control gate of the one of the SGD transistors, and floating voltages of control gates of the memory cells and of the SGS transistor. Further, assume another of the SGD transistors which is unselected for erasing (e.g., SGD1 in FIG. 3A) is in another of the memory strings (e.g., NS1). The drain end of the another of the memory strings is in communication with the bit line (e.g., BL0). While the erase pulse is applied to the bit line, a control gate of the another of the SGD transistors is floated or driven.

During erasing, the memory cell control gates (word lines), back gates, SGS transistor and unselected SGD transistors can float. The selected SGD lines (one, multiple or all SGD lines can be selected) is biased at 0 V and the bit line starts from a low voltage Vbl_erase0. Fowler-Nordheim tunneling occurs in the SGD transistor drain and gate overlap region so that the selected SGD transistor begins to be erased. Once all SGD transistors sharing the same bit line pass the verify level, the bit line voltage is decreased to 0 V so that no more tunneling occurs and erasing of the SGD transistors is inhibited. For other bit lines, Vbl_erase increases at a small step size until all SGD transistors on all bit lines pass the erase verify level and their Vth is within the acceptable range. The erase-verify level can be Vth_max, in one approach, although others implementations are possible as well. For example, the erase-verify level can be below Vth_max by a margin. The erase inhibit can be implemented starting with the first erase pulse.

The above erase process can be considered to be a modification of an erase inhibit technique for memory cells. In such an erase operation, GIDL currents can be generated at both the SGD and SGS transistors in double-sided erase. The bit line and source line are biased at Verase, and the SGD and SGS transistors are biased at Vsgd and Vsgs, respectively. Once all the cells in communication with the same bit line pass erase verify, their bit line voltage is reduced to Vsgd, so there will be no GIDL current generated at the next erase pulse at the bit line side. Meanwhile, the source line bias is slightly higher than the Vsgs control gate voltage to cut off the SGS transistors without GIDL being generated at the source line side. Therefore, there will also be no GIDL generated at source line side. Erase inhibit is thus achieved for the cells which pass the verify level, while the cells that do not pass the verify level have to be erased by GIDL current generated at the bit line side only (in single-sided erase).

FIG. 12A-12E depict example voltages during the program portion of a program-verify iteration of the programming operation of FIG. 11A.

Figure 12A:
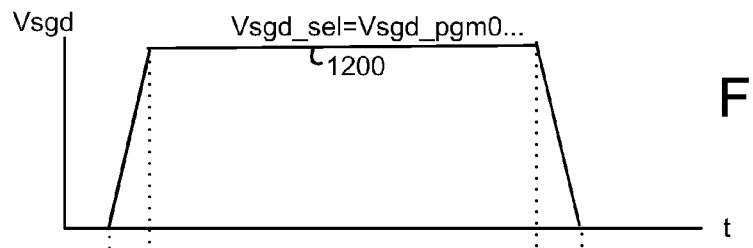
FIG. 12A-12E depict example voltages during the program portion of a program-verify iteration of the programing operation of FIG. 11A.

FIG. 12A depicts example voltages (Vsgd) for the control gates of a selected SGD line (Vsgd_sel). In one approach, Vsgd_sel (waveform 1200) is driven at the amplitude of the current program pulse, e.g., Vsgd_pgm0, Vsgd_pgm1, Vsgd_pgm2, . . . (e.g., 15-20 V)

Figure 12B:
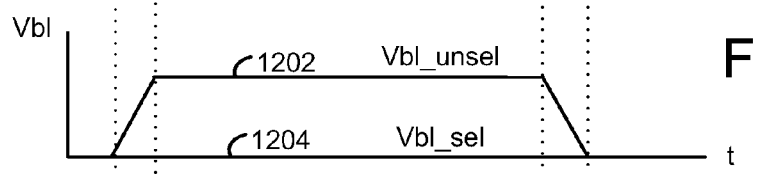

FIG. 12B depicts example voltages for selected bit lines (Vbl_sel) in communication with selected SGD transistors, and unselected bit lines (Vbl_unsel) in communication with inhibited SGD transistors. Vbl_unsel (waveform 1202) is driven to a non-zero level (e.g., 8-10 V), less than Vsgd_sel, while Vbl_sel (waveform 1204) is driven at Vss.

Figure 12C:
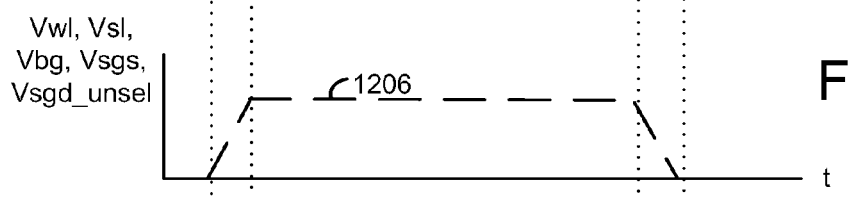

FIG. 12C depicts example voltages for a word line (Vwl), source line (Vsl), back gate (Vbg), a SGS line (Vsgs), and an unselected SGD line (Vsgd_unsel). As depicted by waveform 1206, these voltages can be allowed to float. Although one waveform is shown for simplicity, these voltages can float at different respective levels.

Optionally, some or all of these voltages are driven. For example, Vsgs_sel and Vsgs_unsel can be driven at a 0 V. Vsl can be driven at, e.g., 2 V to cutoff the strings at the source side, such that Vgs (gate-to-source voltage) of the SGS transistor is −2 V.

For the selected sub-block, Vsgd_sel is 15-20 V with the selected bit line at 0 V to program the selected SGD transistors, and with the unselected bit line at, e.g., 8-10 V to inhibit the associated SGD transistors. For the unselected sub-block, Vsgd_unsel is 0 V with the selected bit line at 0 V and the unselected bit line at 8-10 V, so SGD transistors associated with the unselected SGD line are not all programmed.

Figure 12D:
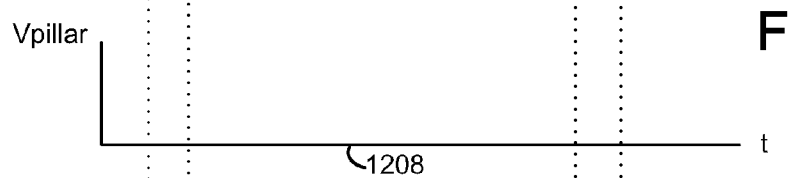

FIG. 12D depicts a pillar voltage (Vpillar) for a selected SGD transistor. Waveform 1208 indicates that Vpillar follows Vbl_sel=Vss.

Figure 12E:
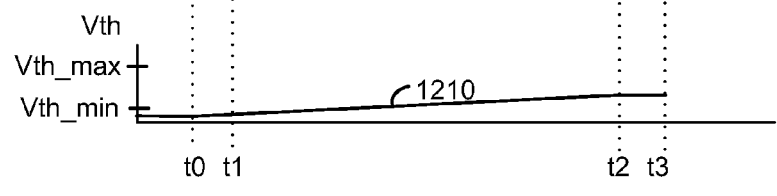

FIG. 12E depicts a Vth of a SGD transistor being programmed. Waveform 1210 indicates that Vth increases gradually while Vsgd_sel is applied. In this case, Vth rises above Vth_min.

As an example, consider that one of the SGD transistors which is selected for programming is in one of the memory strings (e.g., SGD0 in NS0 in FIG. 3A). The one of the memory strings comprises a select gate, source (SGS) transistor (e.g., SGS0) at a source end thereof, and memory cells (e.g., MC300-MC303, FIG. 3E with control gates CG0-CG3, respectively, FIG. 3A) between the one of the SGD transistors and the SGS transistor, and the drain end of the one of the memory strings is in communication with a bit line (e.g., BL0). The programming of one of the SGD transistors comprises applying a program pulse (1200) to a control gate of the one of the SGD transistors while floating voltages of control gates of the memory cells (Vwl) and of the SGS transistor (Vsgs), and applying a voltage to the bit line (Vbl_sel) which is sufficiently low (e.g., less than Vsgd_sel-Vth—a margin) to allow programming of the one of the SGD transistors. Further, assume another of the SGD transistors which is unselected for programming is in another of the memory strings (e.g., SGD1 in NS1 in FIG. 3A), and the drain end of the another of the memory strings is in communication with the bit line (e.g., BL0). Then, while the program pulse is applied to the control gate of the one of the SGD transistors, a voltage (Vsgd_unsel) of a control gate of the another of the SGD transistors is floated. Optionally, the voltage of the control gate of the another of the SGD transistors is driven.

During programming, the memory cell control gates (word lines), back gates, SGS line and unselected SGD line can float. The bit line is biased at 0 V and the selected SGD line (one, multiple or all SGD lines can be selected) is started from a low voltage Vsgd_pgm0 such as 5-10 V. Fowler-Nordheim tunneling occurs in the SGD transistor drain and gate overlap region so that the selected SGD transistor begins to be programmed. Once all SGD transistors sharing the same bit line pass the verify level, the bit line voltage is increased to an inhibit level which is close to Vsgd_pgm so that no more tunneling occurs and programming of the SGD transistors is inhibited. For other bit lines, the SGD voltage (Vsgd_pgm) increases at a small step size until all SGD transistors on all bit lines pass the verify level and their Vth is within the acceptable range. The program-verify level can be Vth_min in one approach although others implementations are possible as well. For example, the program-verify level can exceed Vth_min by a margin. The program inhibit can be implemented starting with the first program pulse.

FIGS. 13A-13C depicts example voltages during the read or verify operations of FIG. 6D.

FIG. 13A depicts a control gate voltage of a selected SGD line which is being read. The voltage can be at Vth_max (waveform 1300) or Vth_min (waveform 1302), for instance, for an erase verify or programming verify operation, respectively.

FIG. 13B depicts a selected bit line voltage during sensing of a SGD transistor. The selected bit line is in communication with a selected SGD transistor in a memory string. In one sensing technique, a voltage Vsense is applied to the bit line and the bit line is allowed to discharge. If the bit line discharges below a trip voltage, Vtrip, which is tied to a sensing current, at a sense time, tsense, as indicated by waveform 1306, the SGD transistor is in a conductive state and its Vth is less than the control gate voltage. If the bit line does not discharge below Vtrip, the SGD transistor is in a non-conductive state and its Vth is greater than (or equal to) the control gate voltage.

FIG. 13C depicts example voltages for a word line (Vwl), back gate (Vbg) and an SGS line (Vsgs). A source line voltage (Vsl) is at 0 V. As depicted by waveform 1308, these voltages can be driven at a pass level, Vpass, to allow the SGD transistor to be read. Vpass is applied to the control gates of the memory cells, back gate transistor and SGS transistor to cause these transistors to be in a conductive state.

In one embodiment, a method is provided for controlling a 3D stacked non-volatile memory device. The 3D stacked non-volatile memory device comprises a plurality of memory strings, each memory string comprising a select gate, drain (SGD) transistor at a drain end of the memory string. The method comprises: performing an adjustment process for the SGD transistors. The performing the adjustment process for the SGD transistors comprises, for each SGD transistor: reading the SGD transistor at a lower control gate voltage Vth_min and at an upper control gate voltage Vth_max, the lower control gate voltage Vth_min and the upper control gate voltage Vth_max define an acceptable range of a threshold voltage of the SGD transistor; programming the SGD transistor if the reading indicates that the threshold voltage of the SGD transistor is below the acceptable range, to raise the threshold voltage to within the acceptable range; and erasing the SGD transistor if the reading indicates that the threshold voltage of the SGD transistor is above the acceptable range, to lower the threshold voltage to within the acceptable range.

In another embodiment, a 3D stacked non-volatile memory device comprises: layers of conductive material which alternate with dielectric layers in a stack; a set of NAND strings, each NAND string comprising a set of memory cells and a select gate drain (SGD) transistor at a drain-side end of the NAND string, the memory cells are in communication with the layers of conductive material, and the SGD transistors are in communication with a common SGD control line; a set of bit lines in communication with the drain-side ends of the NAND strings; and a control circuit. The control circuit, to perform an adjustment for each SGD transistor: performs a read of the SGD transistor at a lower control gate voltage Vth_min and at an upper control gate voltage Vth_max, the lower control gate voltage Vth_min and the upper control gate voltage Vth_max define an acceptable range of a threshold voltage of the SGD transistor, programs the SGD transistor if the read indicates that the threshold voltage of the SGD transistor is below the acceptable range, to raise the threshold voltage to within the acceptable range, and erases the SGD transistor if the reading indicates that the threshold voltage of the SGD transistor is above the acceptable range, to lower the threshold voltage to within the acceptable range.

In another embodiment, a method is provided for controlling a 3D stacked non-volatile memory device. The 3D stacked non-volatile memory device comprising a plurality of memory strings, each memory string comprising a select gate, drain (SGD) transistor at a drain end of the memory string. The method comprises: performing an adjustment process for the SGD transistors, the performing the adjustment process for the SGD transistors comprises, for one or more of the SGD transistors: performing one or more erase-verify iterations until a threshold voltage of the SGD transistor is below a respective level; and performing one or more program-verify iterations until the threshold voltage of the SGD transistor is above a respective level which is a lower boundary of an acceptable range of the threshold voltage of the SGD transistor.

In another embodiment, a method is provided for controlling a 3D stacked non-volatile memory device. The 3D stacked non-volatile memory device comprising a plurality of memory strings, each memory string comprising a select gate, drain (SGD) transistor at a drain end of the memory string. The method comprises: performing an adjustment process for the SGD transistors, the performing the adjustment process for the SGD transistors comprises, for one or more of the SGD transistors: performing one or more program-verify iterations until a threshold voltage of the SGD transistor is above a respective level; and performing one or more erase-verify iterations until the threshold voltage of the SGD transistor is below a respective level which is an upper boundary of an acceptable range of the threshold voltage of the SGD transistor.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for controlling a three-dimensional non-volatile memory device, the method comprising:

performing an adjustment process for SGD transistors of a plurality of memory strings of the three-dimensional non-volatile memory device, the SGD transistors are select gate, drain transistors, the plurality of memory strings comprise one memory string and another memory string, the one memory string comprises one SGD transistor at a drain end of the one memory string, an SGS transistor at a source end of the one memory string and memory cells between the one SGD transistor and the SGS transistor, the another memory string comprises another SGD transistor at a drain end of the another memory string, and the performing the adjustment process for the SGD transistors comprises, for each SGD transistor:
reading the SGD transistor at a lower control gate voltage Vth_min;
reading the SGD transistor at an upper control gate voltage Vth_max, the lower control gate voltage Vth_min and the upper control gate voltage Vth_max define an acceptable range of a threshold voltage of the SGD transistor;
programming the SGD transistor if the reading of the SGD transistor at the lower control gate voltage Vth_min indicates that the threshold voltage of the SGD transistor is below the acceptable range, to raise the threshold voltage to within the acceptable range; and
erasing the SGD transistor if the reading of the SGD transistor at the upper control gate voltage Vth_max indicates that the threshold voltage of the SGD transistor is above the acceptable range, to lower the threshold voltage to within the acceptable range, wherein:
the one SGD transistor is subject to the programming;
the drain end of the one memory string is in communication with a bit line;
the programming of the one SGD transistor comprises applying a program pulse to a control gate of the one SGD transistor while floating voltages of control gates of the memory cells and a voltage of a control gate of the SGS transistor, and applying a voltage to the bit line, a voltage of the program pulse is sufficiently higher than the voltage applied to the bit line to allow programming of the one SGD transistor;
the another SGD transistor is not subject to the programming;
the drain end of the another memory string is in communication with the bit line; and
while the program pulse is applied to the control gate of the one SGD transistor, a voltage of a control gate of the another SGD transistor is not sufficiently higher than the voltage applied to the bit line to allow programming of the another SGD transistor.

2. The method of claim 1, wherein:
the drain ends of the memory strings are in communication with a set of bit lines;
the lower control gate voltage Vth_min is greater than Vsgd-Vbl_mc_inhibit;
Vsgd is a voltage applied to the SGD transistors during a subsequent programming operation of memory cells in the memory strings;
Vbl_mc_inhibit is a voltage applied to unselected bit lines of the set of bit lines during the subsequent programming operation;
the upper control gate voltage Vth_max is less than Vsgd-Vbl_mc_pgm; and
Vbl_mc_pgm is a voltage applied to selected bit lines of the set of bit lines during the subsequent programming operation.

3. The method of claim 1, further comprising:
repeating the performing the adjustment process for a sub-block of the SGD transistors when the sub-block has undergone a specified number of program-erase cycles.

4. The method of claim 1, further comprising:
counting a number of program-erase cycles in the three-dimensional non-volatile memory device; and
repeating the performing the adjustment process for the SGD transistors based on the counting.

5. The method of claim 1, further comprising:
subsequently programming memory cells of the memory strings;
reading the memory cells using an error correction code;
determining a number of correctable errors based on the reading of the memory cells; and
if the number of correctable errors exceeds a threshold, repeating the performing the adjustment process for the SGD transistors.

6. The method of claim 1, wherein:
the programming the SGD transistors is considered to be successfully completed when a number of the SGD transistors subject to the programming whose threshold voltage is not verified to have reached the acceptable range is below a specified number; and
the erasing the SGD transistors is considered to be successfully completed when a number of the SGD transistors subject to the erasing whose threshold voltage is not verified to have reached the acceptable range is below a specified number.

7. The method of claim 1, wherein:
the performing the adjustment process for the SGD transistors occurs during a die sort of the three-dimensional non-volatile memory device; and
the method performed further comprises repeating the performing the adjustment process for the SGD transistors when the three-dimensional non-volatile memory device is operated by an end user.

8. A non-volatile memory device, comprising:
a substrate;
layers of conductive material which alternate with dielectric layers in a stack;
a set of NAND strings, each NAND string comprising a set of memory cells and a SGD transistor at a drain-side end of the NAND string, the SGD transistor is a select gate, drain transistor, the memory cells are in communication with the layers of conductive material, the SGD transistors are in communication with a common SGD control line, the set of memory cells in each NAND string, are formed above the substrate in one or more physical levels of memory cells in a three-dimensional non-volatile memory, the set of memory cells in each NAND string comprise a columnar active area, the set of NAND strings comprises one NAND string and another NAND string, the one NAND string comprises one SGD transistor at a drain-side end of the one NAND string, an SGS transistor at a source end of the one NAND string and memory cells between the one SGD transistor and the SGS transistor, and the another NAND string comprises another SGD transistor at a drain-side end of the another NAND string;
a set of bit lines in communication with the drain-side ends of the NAND strings; and
circuitry, the circuitry, to perform an adjustment for each SGD transistor, is configured to: perform a read of the SGD transistor at a lower control gate voltage Vth_min and at an upper control gate voltage Vth_max, the lower control gate voltage Vth_min and the upper control gate voltage Vth_max define an acceptable range of a threshold voltage of the SGD transistor, program the SGD transistor if the read indicates that the threshold voltage of the SGD transistor is below the acceptable range to raise the threshold voltage to within the acceptable range, and erase the SGD transistor if the read indicates that the threshold voltage of the SGD transistor is above the acceptable range to lower the threshold voltage to within the acceptable range, wherein:

the one SGD transistor is programmed;

the drain-side end of the one NAND string is in communication with a bit line of the set of bit lines;

the circuitry, to program the one SGD transistor, is confugured to apply a program pulse to a control gate of the one SGD transistor while floating voltages of control gates of the memory cells of the one NAND string and a voltage of a control gate of the SGS transistor, and apply a voltage to the bit line, a voltage of the program pulse is sufficiently higher than the voltage applied to the bit line to allow programming of the one SGD transistor;

the another SGD transistor is not programmed;

the drain-side end of the another NAND string is in communication with the bit line; and while the program pulse is applied to the control gate of the one SGD transistor, a voltage of a control gate of the another SGD transistor is not sufficiently higher than the voltage applied to the bit line to allow programming of the another SGD transistor.

9. The non-volatile memory device of claim 8, wherein:

the drain-side ends of the memory strings are in communication with a set of bit lines;

the lower control gate voltage Vth_min is greater than Vsgd-Vbl_mc_inhibit;

Vsgd is a voltage applied to the SGD transistors during a subsequent programming operation of memory cells in the memory strings;

Vbl_mc_inhibit is a voltage applied to unselected bit lines of the set of bit lines during the subsequent programming operation;

the upper control gate voltage Vth_max is less than Vsgd-Vbl_mc_pgm; and

Vbl_mc_pgm is a voltage applied to selected bit lines of the set of bit lines during the subsequent programming operation.

10. The non-volatile memory device of claim 8, wherein the circuitry is configured to:

program the memory cells of the NAND strings;

read the memory cells of the NAND strings using an error correction code;

determine a number of correctable errors based on the read of the memory cells; and if the number of correctable errors exceeds a threshold, repeat the adjustment for the SGD transistors.

11. The method of claim 1, wherein:

for the one SGD transistor: the reading of the one SGD transistor at the lower control gate voltage Vth_min indicates that the threshold voltage of the one SGD transistor is below the acceptable range, the one SGD transistor is subsequently subject to the programming, the reading of the one SGD transistor at the upper control gate voltage Vth_max subsequently indicates that the threshold voltage of the one SGD transistor is above the acceptable range, and one SGD transistor is subsequently subject to the erasing.

12. The method of claim 1, wherein:

for the one SGD transistor: the reading of the one SGD transistor at the upper control gate voltage Vth_max indicates that the threshold voltage of the one SGD transistor is above the acceptable range, the one SGD transistor is subsequently subject to the erasing, the reading of the one SGD transistor at the lower control gate voltage Vth_min subsequently indicates that the threshold voltage of the one SGD transistor is below the acceptable range, and the one SGD transistor is subsequently subject to the programming.

13. The non-volatile memory device of claim 8, wherein: the circuitry is within the substrate.

14. The non-volatile memory device of claim 8, wherein: the circuitry is above the substrate.

15. A method for controlling a non-volatile memory device, comprising:

performing a read operation involving first and second memory strings, the first memory string comprising a first drain-side select gate transistor at a drain end of the first memory string, a first source-side select gate transistor at a source end of the first memory string and memory cells between the first drain-side select gate transistor and the first source-side select gate transistor, the second memory string comprising a second drain-side select gate transistor at a drain end of the second memory string, a second source-side select gate transistor at a source end of the second memory string and memory cells between the second drain-side select gate transistor and the second source-side select gate transistor, where the drain end of the first memory string and the drain end of the second memory string are in communication with a common bit line, the read operation determines that a threshold voltage of the first drain-side select gate transistor is below an acceptable range and that a threshold voltage of the second drain-side select gate transistor is not below the acceptable range; and in response to the performing the read operation, programming the first drain-side select gate transistor while preventing programming of the second drain-side select gate transistor, the programming the first drain-side select gate transistor comprises applying a program voltage to a control gate of the first drain-side select gate transistor while floating voltages of control gates of the memory cells of the first memory string and floating a voltage of the first source-side select gate transistor, and applying a voltage to the common bit line, where the program voltage is sufficiently higher than the voltage applied to the common bit line to allow programming of the first drain-side select gate transistor, and the preventing programming of the second drain-side select gate transistor comprises providing a voltage at a control gate of the second drain-side select gate transistor which is not sufficiently higher than the voltage applied to the common bit line to allow programming of the second drain-side select gate transistor.

16. A method for controlling a three-dimensional non-volatile memory device, the method comprising:

performing an adjustment process for SGD transistors of a plurality of memory strings of the three-dimensional non-volatile memory device, the SGD transistors are select gate, drain transistors, the plurality of memory strings comprise one memory string and another memory string, the one memory string comprises one SGD transistor at a drain end of the one memory string, an SGS transistor at a source end of the one memory string and memory cells between the one SGD transistor and the SGS transistor, the another memory string comprises another SGD transistor at a drain end of the another memory string, and the performing the adjustment process for the SGD transistors comprises, for each SGD transistor:

reading the SGD transistor at a lower control gate voltage Vth_min;

reading the SGD transistor at an upper control gate voltage Vth_max, the lower control gate voltage Vth_min and the upper control gate voltage Vth_max define an acceptable range of a threshold voltage of the SGD transistor;

programming the SGD transistor if the reading of the SGD transistor at the lower control gate voltage Vth_min indicates that the threshold voltage of the SGD transistor is below the acceptable range, to raise the threshold voltage to within the acceptable range; and erasing the SGD transistor if the reading of the SGD transistor at the upper control gate voltage Vth_max indicates that the threshold voltage of the SGD transistor is above the acceptable range, to lower the threshold voltage to within the acceptable range, wherein:

the one SGD transistor is subject to the erasing;

the drain end of the one memory string is in communication with a bit line;

the erasing of the one SGD transistor comprises applying an erase pulse to the bit line while applying a voltage to a control gate of the one SGD transistor and floating voltages of control gates of the memory cells and a voltage of a control gate of the SGS transistor, a voltage of the erase pulse is sufficiently higher than the voltage applied to the control gate of the one SGD transistor to charge up a channel of the one SGD transistor;

the another SGD transistor is not subject to the erasing;

the drain end of the another memory string is in communication with the bit line; and while the erase pulse is applied to the bit line, the voltage of the erase pulse is not sufficiently higher than a voltage of a control gate of the another SGD transistor to charge up a channel of the another SGD transistor.

\* \* \* \* \*

UNITED STATES PATENT AND TRADEMARK OFFICE
CERTIFICATE OF CORRECTION

PATENT NO. : 8,867,271 B2
APPLICATION NO. : 13/484088
DATED : October 21, 2014
INVENTOR(S) : Li et al.

Page 1 of 1

It is certified that error appears in the above-identified patent and that said Letters Patent is hereby corrected as shown below:

In the Claims

Claim 8, col. 25, lines 6-7: After "is" and before "to" delete "confugured" and replace with -- configured --.

Signed and Sealed this
Twenty-fourth Day of February, 2015

Michelle K. Lee
*Deputy Director of the United States Patent and Trademark Office*